(12) United States Patent
Toda

(10) Patent No.: US 11,231,534 B2
(45) Date of Patent: Jan. 25, 2022

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Atsushi Toda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 120 days.

(21) Appl. No.: 16/491,682

(22) PCT Filed: Mar. 1, 2018

(86) PCT No.: PCT/JP2018/007687
§ 371 (c)(1),
(2) Date: Sep. 6, 2019

(87) PCT Pub. No.: WO2018/168482
PCT Pub. Date: Sep. 20, 2018

(65) Prior Publication Data
US 2020/0033519 A1 Jan. 30, 2020

(30) Foreign Application Priority Data
Mar. 16, 2017 (JP) .............................. JP2017-050789

(51) Int. Cl.
*H01L 27/146* (2006.01)
*G02B 5/28* (2006.01)
(Continued)

(52) U.S. Cl.
CPC .............. *G02B 5/28* (2013.01); *G02B 5/285* (2013.01); *G02B 6/4206* (2013.01);
(Continued)

(58) Field of Classification Search
CPC ....................................................... H01L 27/146
See application file for complete search history.

(56) References Cited

U.S. PATENT DOCUMENTS

| 2005/0180010 A1* | 8/2005 | Mukaiyama ........... G02B 27/46 |
| | | 359/487.04 |
| 2009/0020690 A1 | 1/2009 | Toda |

(Continued)

FOREIGN PATENT DOCUMENTS

| CN | 1657980 A | 8/2005 |
| CN | 101320745 A | 12/2008 |

(Continued)

OTHER PUBLICATIONS

International Search Report and Written Opinion of PCT Application No. PCT/JP2018/007687, dated May 15, 2018, 13 pages of ISRWO.

*Primary Examiner* — Christopher A Johnson
(74) *Attorney, Agent, or Firm* — Chip Law Group

(57) ABSTRACT

To provide a sensor capable of enhancing reliability and image quality. There is provided a solid-state imaging device including a functional element, a spectroscopic element, a semiconductor substrate, and a photoelectric conversion element formed in the semiconductor substrate, in which the spectroscopic element is disposed between the functional element and the photoelectric conversion element, and the functional element corrects incident light to light in a direction substantially perpendicular to the photoelectric conversion element.

14 Claims, 23 Drawing Sheets

(51) Int. Cl.
*H01L 31/0232* (2014.01)
*H04N 5/369* (2011.01)
*G02B 27/00* (2006.01)
*G02B 6/42* (2006.01)

(52) U.S. Cl.
CPC .... *G02B 27/0025* (2013.01); *H01L 27/14625* (2013.01); *H01L 31/0232* (2013.01); *H04N 5/369* (2013.01)

(56) References Cited

U.S. PATENT DOCUMENTS

| | | |
|---|---|---|
| 2010/0253828 A1 | 10/2010 | Yamada |
| 2011/0096210 A1 | 4/2011 | Koshino et al. |
| 2011/0121422 A1* | 5/2011 | Saitou ............... H01L 27/14685 257/432 |
| 2012/0081587 A1 | 4/2012 | Ryu |
| 2014/0146207 A1* | 5/2014 | Yokogawa ............. G02B 5/201 348/281 |
| 2016/0211388 A1 | 7/2016 | Natsuaki et al. |

FOREIGN PATENT DOCUMENTS

| | | |
|---|---|---|
| CN | 102105985 A | 6/2011 |
| CN | 103733340 A | 4/2014 |
| CN | 105518875 A | 4/2016 |
| EP | 1564566 A1 | 8/2005 |
| EP | 2738810 A1 | 6/2014 |
| JP | 2005-234038 A | 9/2005 |
| JP | 2009-015315 A | 1/2009 |
| JP | 2009-171065 A | 7/2009 |
| JP | 2010-027746 A | 2/2010 |
| JP | 2010-243682 A | 10/2010 |
| JP | 2011-096732 A | 5/2011 |
| JP | 2013-030626 A | 2/2013 |
| KR | 10-2006-0041960 A | 5/2006 |
| KR | 10-2008-0106854 A | 12/2008 |
| KR | 10-2012-0033702 A | 4/2012 |
| KR | 10-2014-0053948 A | 5/2014 |
| TW | 200602692 A | 1/2006 |
| TW | 201308585 A | 2/2013 |
| WO | 2010/007792 A1 | 1/2010 |
| WO | 2013/015117 A1 | 1/2013 |
| WO | 2015/025637 A1 | 2/2015 |

* cited by examiner

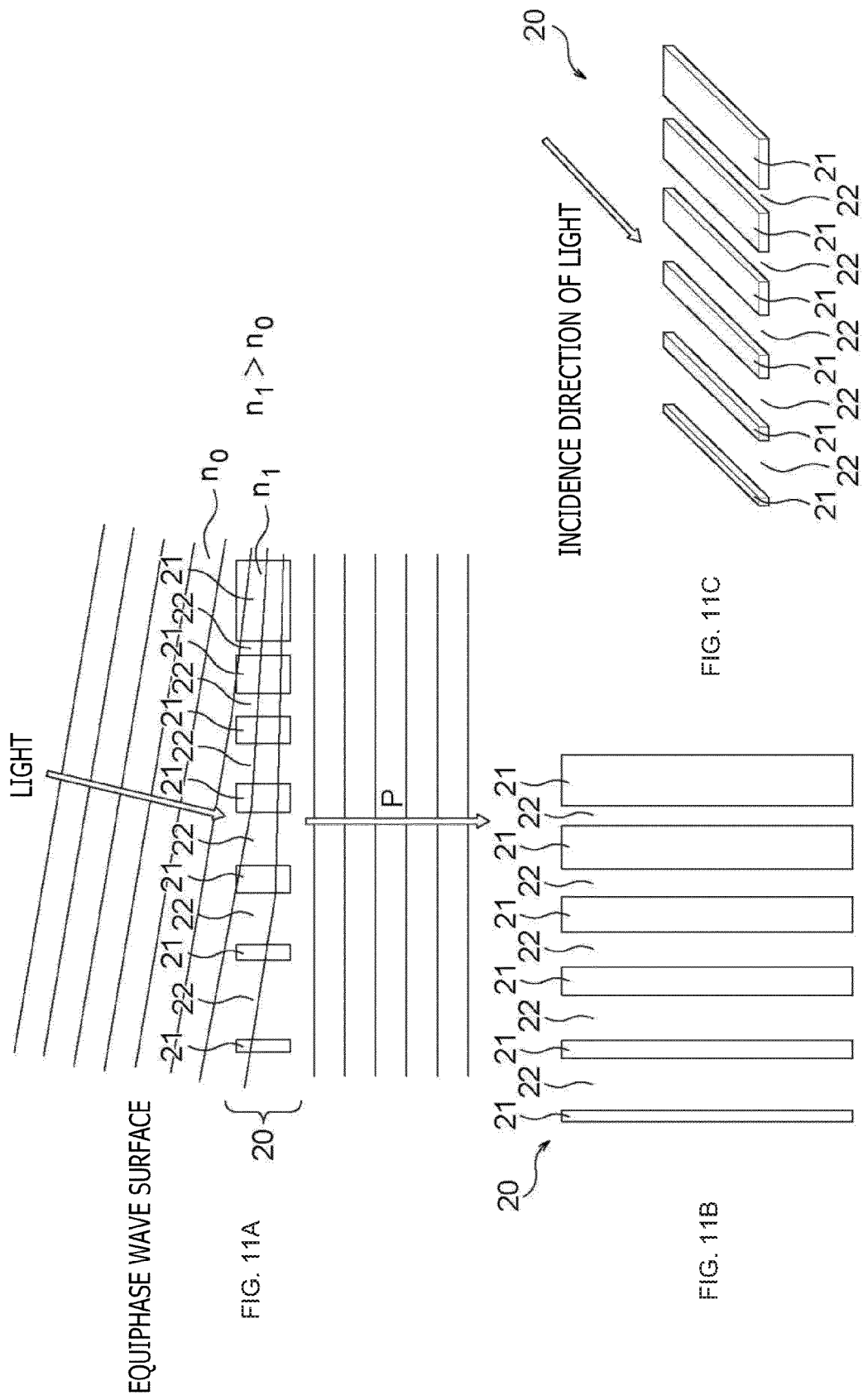

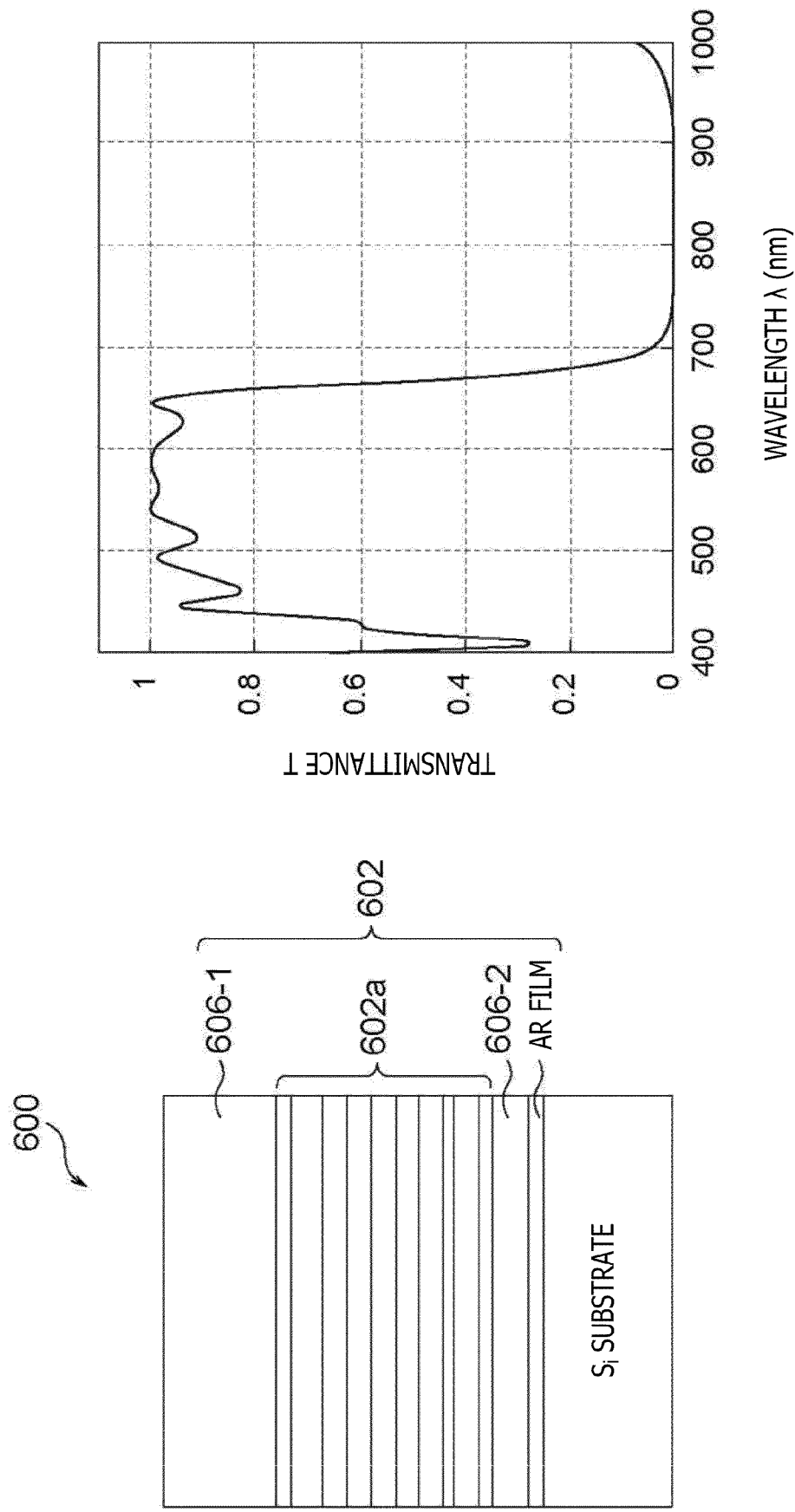

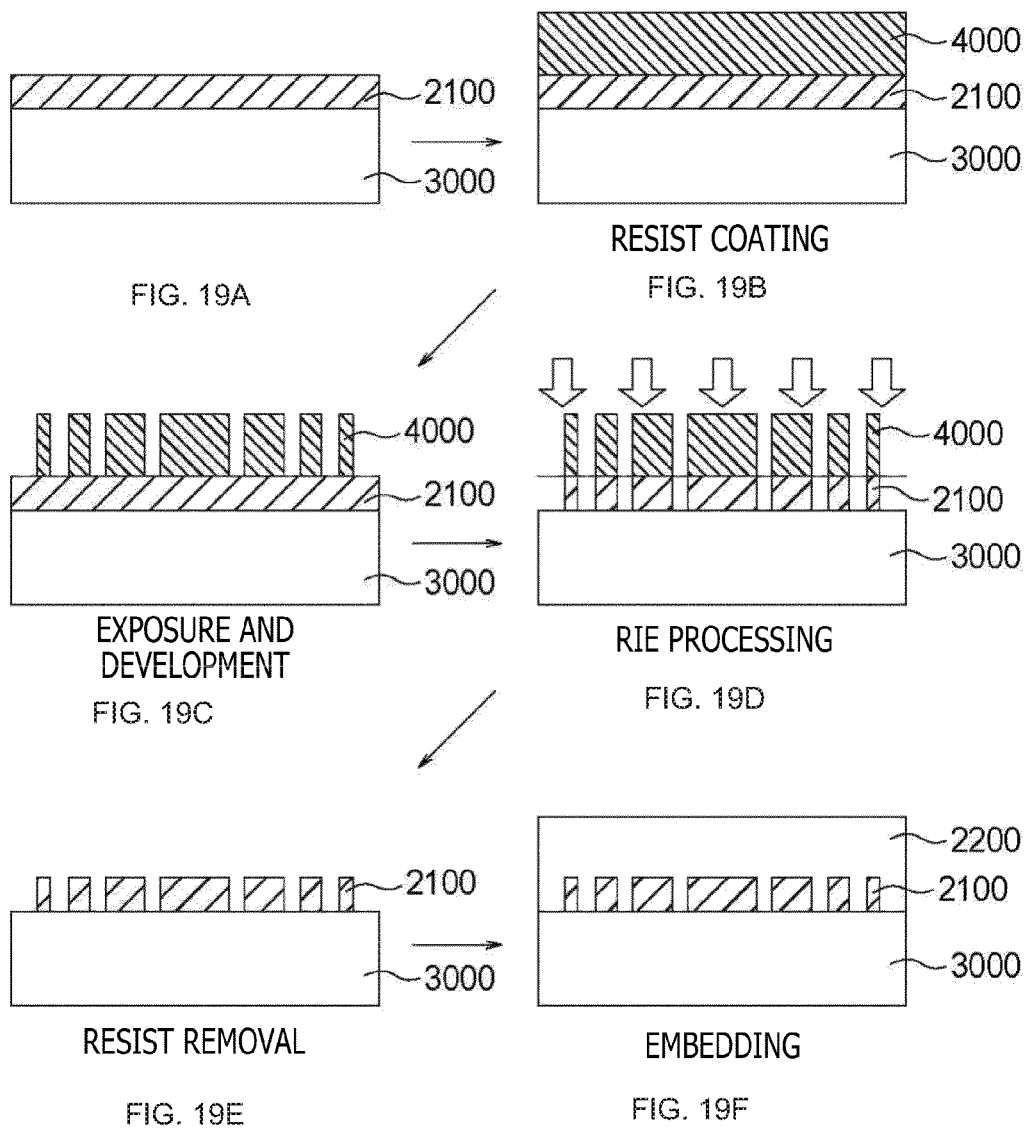

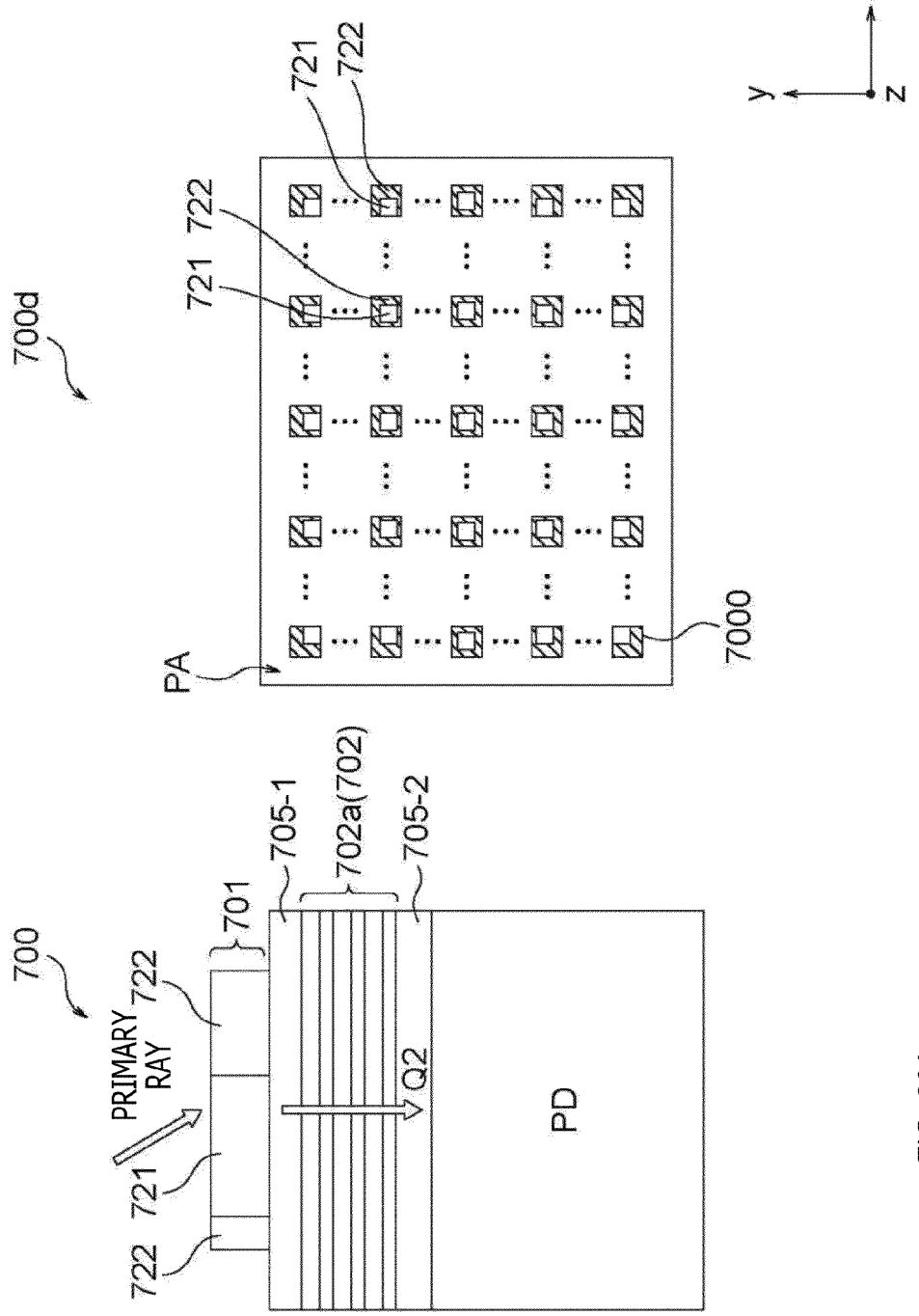

SOLID-STATE IMAGING DEVICE AND ELECTRONIC APPARATUS

CROSS REFERENCE TO RELATED APPLICATIONS

This application is a U.S. National Phase of International Patent Application No. PCT/JP2018/007687 filed on Mar. 1, 2018, which claims priority benefit of Japanese Patent Application No. JP 2017-050789 filed in the Japan Patent Office on Mar. 16, 2017. Each of the above-referenced applications is hereby incorporated herein by reference in its entirety.

TECHNICAL FIELD

The present technology relates to a solid-state imaging device and an electronic apparatus.

BACKGROUND ART

In recent years, from optoelectronics in general to the fields related to solid-state imaging devices such as CMOS (Complementary Metal Oxide Semiconductor) image sensors (CIS) and CCD (Charge Coupled Device), it has been practiced to appropriately grasp the market needs and to perform various researches and developments for enhancing image quality and reliability.

For example, there has been proposed an imaging device having an image sensor including a plurality of unit pixels arranged on a chip, in which the image sensor includes photoelectric conversion elements for photoelectric conversion of incident light on a unit pixel basis, and filters which are disposed on an upper side of the photoelectric conversion elements and selectively transmit only part of wavelengths of the incident light to separate color components, the filters are a multilayer film filters formed from an inorganic material, and the half-value width of the band selectively transmitted is narrower than 100 nm (see PTL 1).

CITATION LIST

Patent Literature

PTL 1
JP 2007-103401A

SUMMARY

Technical Problem

However, according to the technology proposed in PTL 1, it may be impossible to realize further enhancement of reliability or further enhancement of image quality. Accordingly, there is desired a solid-state imaging device further enhanced in reliability and further enhanced in image quality.

The present technology has been made in consideration of the above-mentioned circumstances. It is a principal object to provide a solid-state imaging device enhanced in reliability and image quality and an electronic apparatus including the solid-state imaging device.

Solution to Problem

The present inventor made extensive and intensive researches for solving the above-mentioned object, and as a result of the researches, and succeeded in developing a solid-state imaging device enhanced in reliability and image quality, to come to complete the present technology.

According to the present technology, there is provided a solid-state imaging device including a functional element, a spectroscopic element, a semiconductor substrate, and a photoelectric conversion element formed in the semiconductor substrate, in which the spectroscopic element is disposed between the functional element and the photoelectric conversion element, and the functional element corrects incident light to light in a direction substantially perpendicular to the photoelectric conversion element.

In the solid-state imaging device according to the present technology, a plurality of pixels may be arranged one-dimensionally or two-dimensionally, and the functional element, the spectroscopic element, and the photoelectric conversion element may be provided on the pixel basis.

In addition, in the solid-state imaging device according to the present technology, a plurality of pixels may be arranged one-dimensionally or two-dimensionally, the functional element and the spectroscopic element may be provided on the basis of at least two of the pixels, and the photoelectric conversion element may be provided on the pixel basis.

The functional element may have a focusing function.

The functional element may include a substrate having a curved surface shape.

The functional element may have a refractive index distribution structure, and the refractive index distribution structure may be asymmetric.

The refractive index distribution structure may have a pattern including a high refractive index material and a low refractive index material.

The refractive index distribution structure may have a pattern which includes a high refractive index material and a low refractive index material and which has a gap of not more than a wavelength order.

The refractive index distribution structure may have a ring pattern or a polygonal pattern.

The asymmetry of the refractive index distribution structure may vary according to a size of image height with reference to a center of an imaging surface.

A correcting power for correcting the incident light to light in a direction substantially perpendicular to the photoelectric conversion element may vary according to the size of image height with reference to a center of an imaging surface.

The spectroscopic element may include at least one optical interference filter.

The spectroscopic element may include a metallic film having a hole array structure.

Besides, according to the present technology, there is provided an electronic apparatus including the solid-state imaging device according to the present technology.

Advantageous Effect of Invention

According to the present technology, it is possible to enhance reliability and image quality. Note that the effect described here is not necessarily limited, and the present technology may have any of the effects described herein.

BRIEF DESCRIPTION OF DRAWINGS

FIGS. 11A, 11B, and 11C illustrate figures depicting a parallel plate carving structure which the functional element has.

FIGS. 17A and 17B illustrate a figure depicting a sectional configuration of a spectroscopic element for cutting infrared rays, which is provided in the solid-state imaging device of Example 1 of the present technology, and a diagram depicting transmission spectral characteristics of the spectroscopic element.

FIGS. 19A, 19B, 19C, 19D, 19E, and 19F illustrate figures depicting a production process of a functional element.

FIGS. 20A and 20B illustrate a figure depicting a sectional configuration of a solid-state imaging device of Example 2 of the present technology, and a figure depicting an imaging surface.

DESCRIPTION OF EMBODIMENTS

Figure 1A:
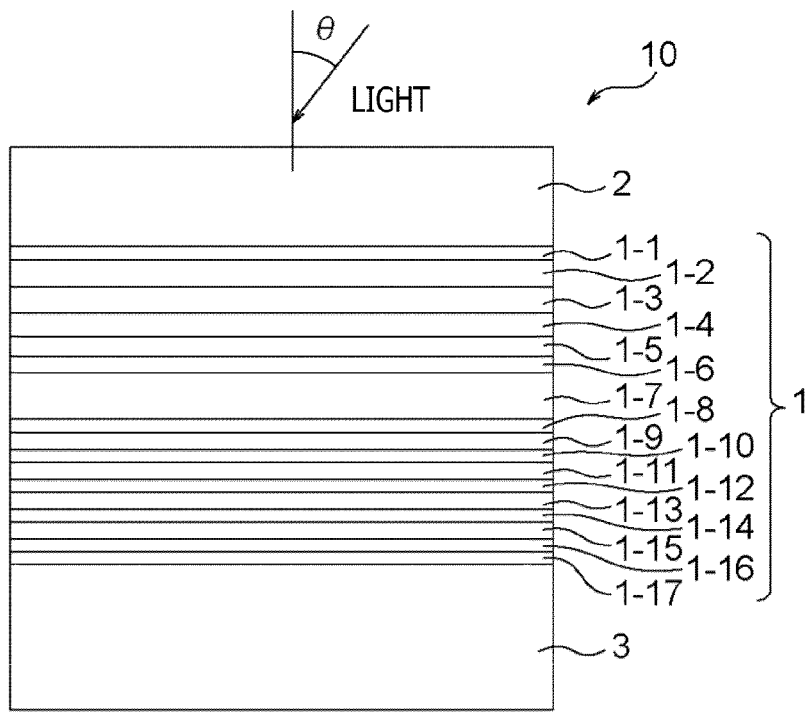
FIGS. 1A and 1B illustrate a sectional view depicting a configuration example of a spectroscopic element, and a diagram depicting transmission spectral characteristics when light is substantially perpendicularly incident on the spectroscopic element.

A preferred mode for carrying out the present technology will be described below referring to the drawings. The embodiment described below is an example of typical embodiments of the present technology, and the scope of the present technology is not to be construed narrowly thereby. Note that in the drawings, the same or equivalent elements or members are denoted by the same reference signs, and repeated descriptions thereof will be omitted.

Note that the description will be made in the following order.

1. Outline of the present technology
2. First embodiment (Example 1 of solid-state imaging device)
3. Second embodiment (Example 2 of solid-state imaging device)
4. Third embodiment (Example of electronic apparatus)
5. Use examples of solid-state imaging device according to the present technology 1. Outline of the Present Technology In the past, a spectroscopic type image sensor using a multilayer film of a Fabry-Perot resonator or a filter such as a metal hole array has been applied as a visible/infrared simultaneous acquiring sensor (for example, an image sensor, a photosensor, etc.) which has a degree of freedom in spectrum design and has a multi-spectrum or IR-cut filter function with a narrowed half-value width. However, both filters have a problem that in the case where a principal ray is obliquely incident, a wavelength shift of a transmission peak wavelength or an IR-cut wavelength is generated.

Figure 1B:
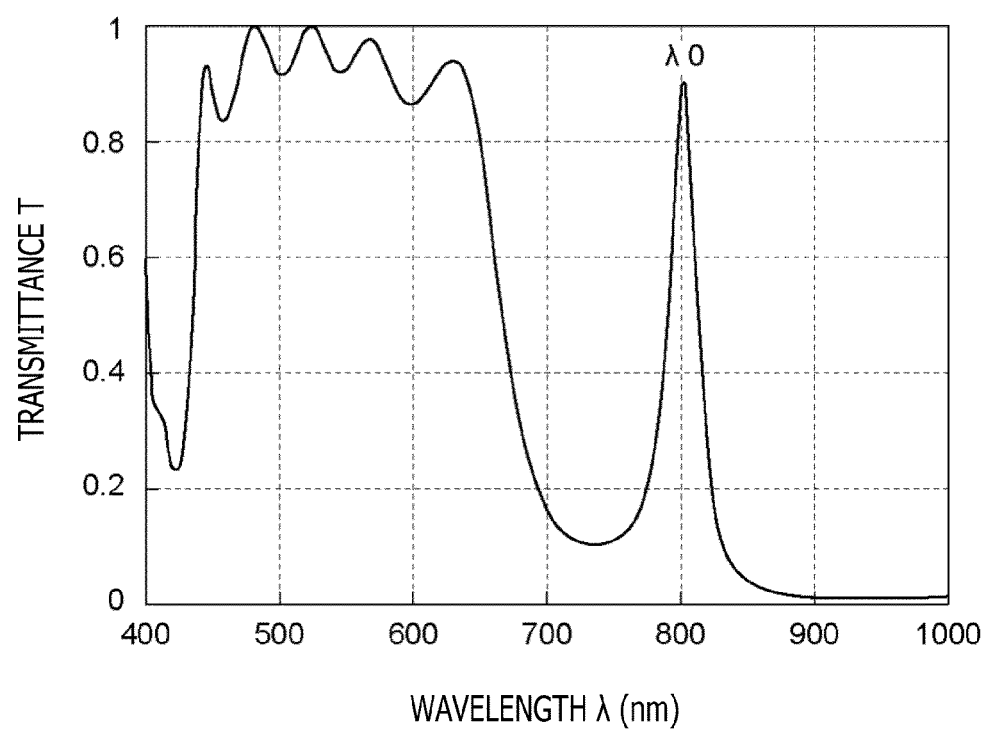

FIGS. 1A, 1B, 2, 3, and 4 are the results of a simulation made using the effective Fresnel coefficient method. FIG. 1A depicts an example of sectional configuration of a spectroscopic element 10 (Fabry-Perot resonator) using a simulation, and FIG. 1B is a diagram depicting transmission spectroscopy when light is perpendicularly incident. In FIG. 1B, the axis of ordinates is transmittance T, and the axis of abscissas is wavelength A (nm). The spectroscopic element 10 (Fabry-Perot resonator) includes a substrate 2, a 17-layer optical interference filter 1 (1-1 to 1-17), and a substrate 3, in this order from the light incidence side. Of the 17-layer optical interference filter 1, the optical interference filters 1-1 and 1-17 are SiN layers, the optical interference filters 1-2, 1-4, 1-6, 1-8, 1-10, 1-12, 1-14, and 1-16 are TiO2 layers, and the optical interference filters 1-3, 1-5, 1-7, 1-9, 1-11, 1-13, and 1-15 are SiO2 layers. In other words, the optical interference filter 1 has the SiN layers as the outermost layers, and the TiO2 layers and SiO2 layers are alternately stacked between the two SiN layers. Here, an incidence angle θ indicated in FIG. 1A is an angle relative to a normal to a flat surface (a flat surface of the substrate 2 as the uppermost layer) of the spectroscopic element 10, and perpendicular incidence corresponds to θ=0 deg. This definition of the incidence angle θ applies also to the other drawings in the present technology.

Figure 2:
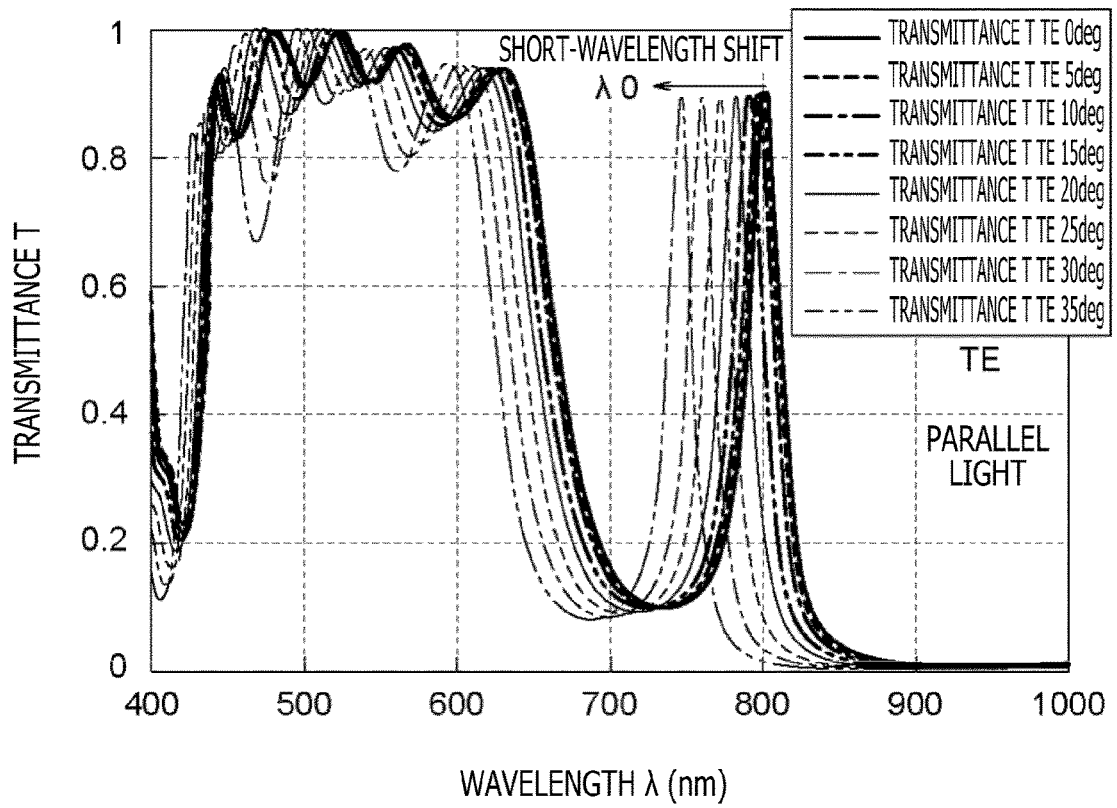
FIG. 2 is a diagram depicting transmission spectral characteristics when light of a TE wave with light incidence angle varied is incident on the spectroscopic element.
Figure 3:
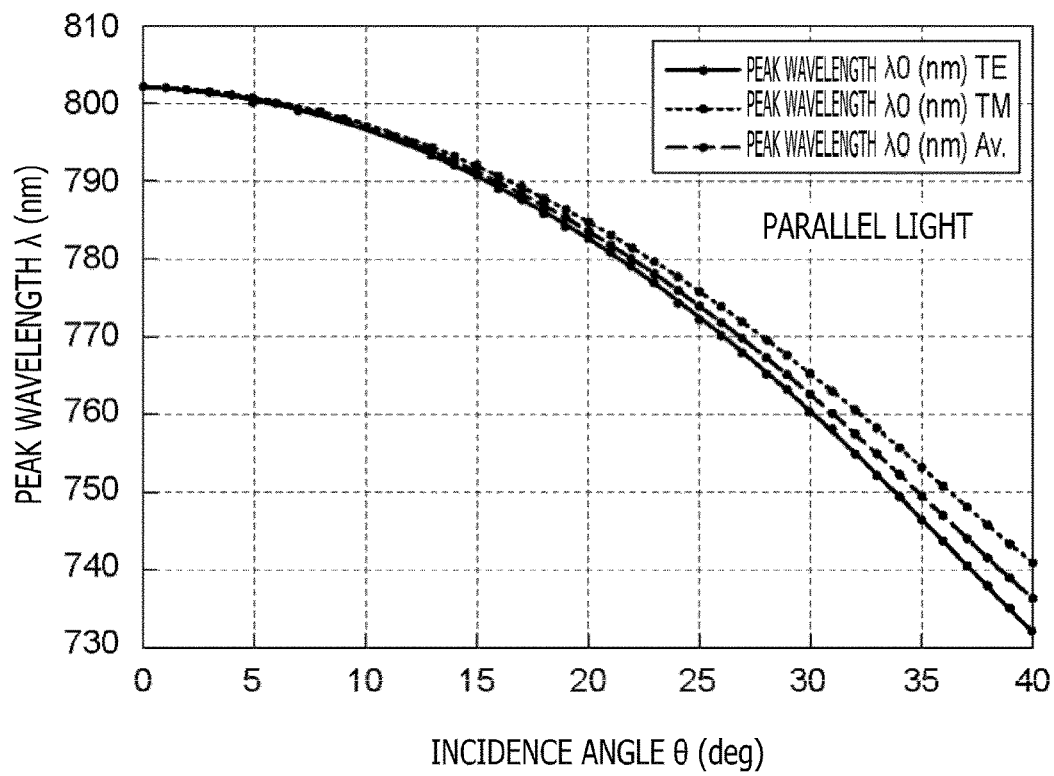
FIG. 3 is a diagram depicting light incidence angle dependency of peak wavelength.
Figure 4:
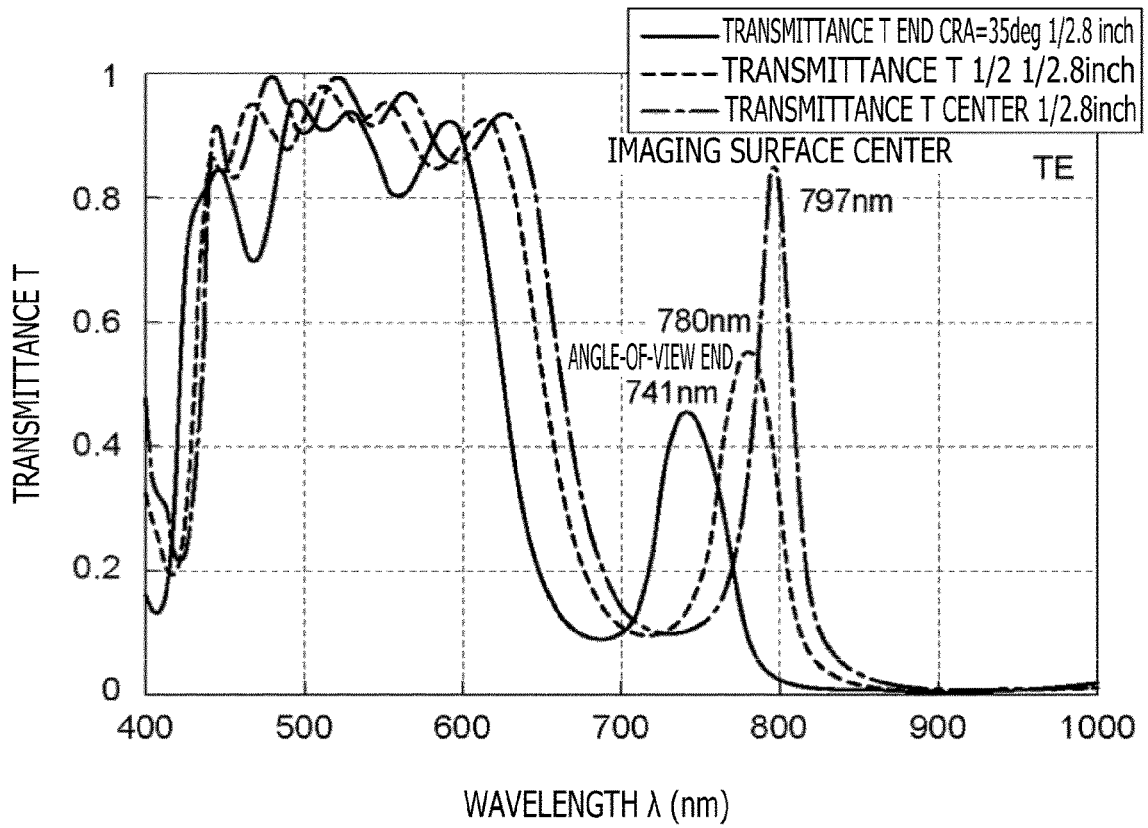
FIG. 4 is a diagram depicting spectrum of each image height on an imaging surface.
Figure 5:
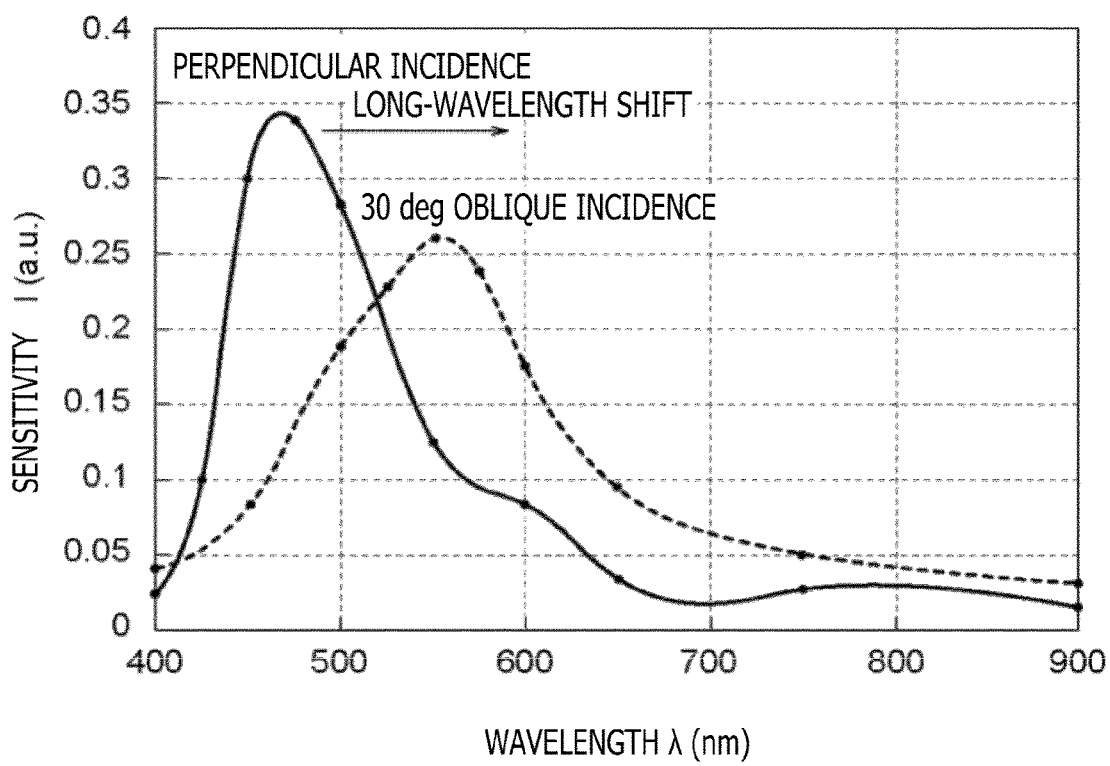
FIG. 5 is a diagram depicting spectral characteristics of oblique light incidence of an abnormal transmission phenomenon due to metal surface plasmon resonance.

FIG. 2 depicts variation in TE wave transmission spectral characteristics when the incidence angle of light on a Fabry-Perot resonator is varied. In addition, FIG. 3 depicts incidence angle θ dependency of peak wavelength λ0 in terms of a TE wave, a TM wave and an average of them. Further, FIG. 4 depicts the results of a simulation of variation in optical spectrum in relation to image height in the case of application to an actual camera, and depicts optical spectra with respect to a center position, ½ positions from both angle-of-view ends, and the angle-of-view ends. As the image height increases with reference to the center of an imaging surface and the angle-of-view end is approached, it is seen that the peak wavelength is shifted to the shorter wavelength side, and the peak intensity is reduced and the peak is broadened. This makes practical use difficult. Besides, since the incidence angle of a principal ray cannot be enlarged, there arises a limitation as to optical design of a lens and the like. In addition, a similar phenomenon is observed also in spectroscopy (FIG. 5) using an abnormal transmission phenomenon due to surface plasmon resonance where holes are periodically formed in a metallic film. FIG. 5 is a graph depicting the relation between sensitivity (axis of ordinates) and wavelength λ (nm) (axis of abscissas), and it is seen that in the case of oblique light (θ=30 deg), the peak wavelength is shifted to the longer wavelength side as compared to the case of perpendicular incidence.

The present technology is based on the above-mentioned circumstances, and the present technology produces effects of excellent reliability and excellent image quality. Specifically, according to the present technology, in a solid-state imaging device or the like having spectroscopy by a spectroscopic element, for example, a multilayer film (an optical interference filter including a plurality of layers) or a Fabry-Perot resonator or the like or spectroscopy by an abnormal transmission phenomenon due to surface plasmon resonance of metal, it is possible to solve the problem of a shift of peak wavelength, peak intensity, and broadening, due to the principal ray being oblique light. Particularly, it is possible to reduce the above-mentioned phenomenon occurring where the image height is large on the imaging surface of the solid-state imaging device, and to achieve uniform spectroscopy in the imaging surface. More specifically, according to the present technology, the problem in which shifting of peak wavelength and broadening (a lowering in sensitivity of peak wavelength) in optical spectrum obtained using a multilayer film (an optical interference filter including at least one layer) or a Fabry-Perot resonator or a metal plasmon or the like occurs when a principal ray is obliquely incident, and the resulting variation in spectrum shape, can be prevented. By this, the same optical spectrum can be obtained in the range of the center of an imaging surface to angle-of-view ends where the image height is large. As a result, the present technology is applicable to multi-spectrum spectroscopy and applied technologies requiring the spectrally dispersed image, for example, technologies concerning biometrics authentication, cosmetics, medicine, agricultural testing, etc.

The solid-state imaging device according to the present technology is a solid-state imaging device which includes a functional element, a spectroscopic element, a semiconductor substrate, and a photoelectric conversion element formed in the semiconductor substrate, in which the spectroscopic element is disposed between the functional element and the photoelectric conversion element, and the functional element corrects incident light to light in a direction substantially perpendicular to the photoelectric conversion element. Here, that light is in a direction substantially perpendicular to the photoelectric conversion element means that the light is in a direction substantially perpendicular to a light-receiving surface of the photoelectric conversion element (for example, a photodiode, an organic photoelectric conversion element, et.), and, in the case where the light-receiving surface of the photoelectric conversion element is substantially parallel to a light-receiving side surface of the semiconductor substrate and a light-receiving side surface of the spectroscopic element, means that the light is in a direction substantially perpendicular to also the light-receiving side surface of the semiconductor substrate and the light-receiving side surface of the spectroscopic element.

Figure 6:
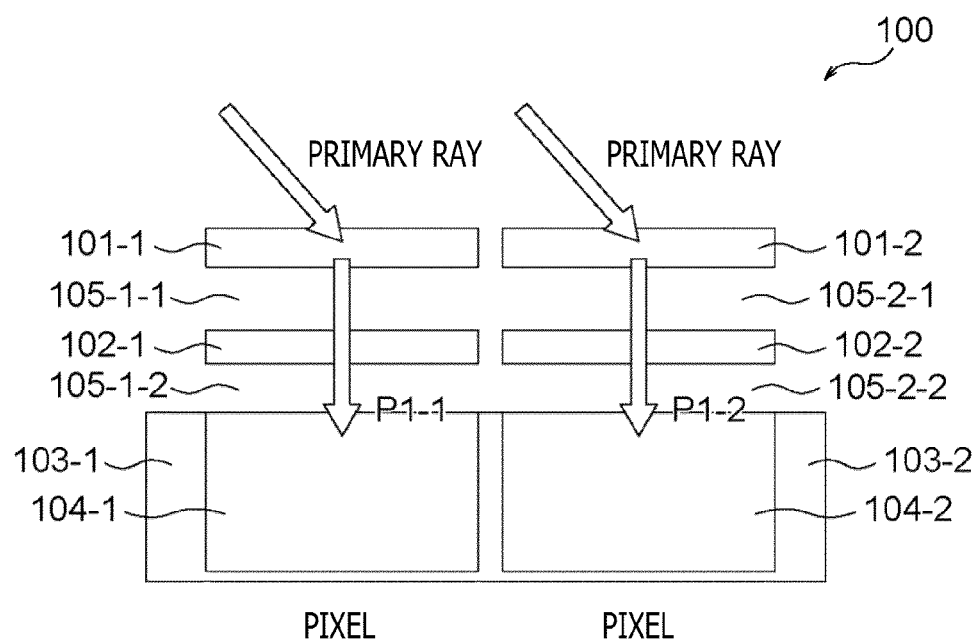
FIG. 6 is a sectional view depicting a configuration example of a solid-state imaging device according to the present technology.

An example of the solid-state imaging device according to the present technology is depicted in FIG. 6. FIG. 6 is a figure illustrating a sectional configuration of a solid-state imaging device 100. The solid-state imaging device 100 includes one functional element, one spectroscopic element, and one photodiode (PD) formed in a semiconductor substrate, in one pixel, and FIG. 6 depicts a device portion corresponding to two pixels.

In the solid-state imaging device 100, the pixel on the left side in FIG. 6 includes a functional element 101-1, an insulating film 105-1-1, a spectroscopic element 102-1, an insulating film 105-1-2, a semiconductor substrate 103-1, and a photodiode (photoelectric conversion element) 104-1 formed in the semiconductor substrate 103-1, in this order from the light incidence side. On the other hand, the pixel on the right side in FIG. 6 includes a functional element 101-2, an insulating film 105-2-1, a spectroscopic element 102-2, an insulating film 105-2-2, a semiconductor substrate 103-2, and a photodiode (photoelectric conversion element) 104-2 formed in the semiconductor substrate 103-2, in this order from the light incidence side.

As the spectroscopic elements 102-1 and 102-2, there may be used a Fabry-Perot resonator (spectroscopic element) 10 as depicted in FIG. 1A, a metallic film having a hole array structure (a spectroscopic element of a metal surface plasmon), or the like. The functional elements 101-1 and 101-2 are capable of correcting a primary ray obliquely incident (incident from a left direction in FIG. 6) to convert it to light in a direction (direction of arrow P1-1 and arrow P1-2) substantially perpendicular to light-receiving surfaces of the spectroscopic elements 102-1 and 102-2 and the photodiodes (photoelectric conversion elements) 104-1 and 104-2. By the light in the substantially perpendicular direction (the direction of arrow P1-1 and arrow P1-2), wavelength shifting and broadening (a lowering in sensitivity at a peak wavelength) and the like can be mitigated.

2. First Embodiment (Example 1 of Solid-State Imaging Device)

The solid-state imaging device of a first embodiment (Example 1 of solid-state imaging device) of the present technology is a solid-state imaging device which includes a functional element, a spectroscopic element, a semiconductor substrate, and a photoelectric conversion element formed in the semiconductor substrate, in which the spectroscopic element is disposed between the functional element and the photoelectric conversion element, and the functional element corrects incident light to light in a direction substantially perpendicular to the photoelectric conversion element.

In the solid-state imaging device of the first embodiment of the present technology, a plurality of pixels is arranged one-dimensionally or two-dimensionally, and the functional element, the spectroscopic element, and the photoelectric conversion element are provided on a pixel basis.

The solid-state imaging device of the first embodiment of the present technology will be described in detail below, referring to FIGS. 7A, 7B, 8, 9, 10A, 10B, 11A, 11B, 11C, 12, 13A, 13B, 13C, 13D, and 14.

Figures 7A, 7B:
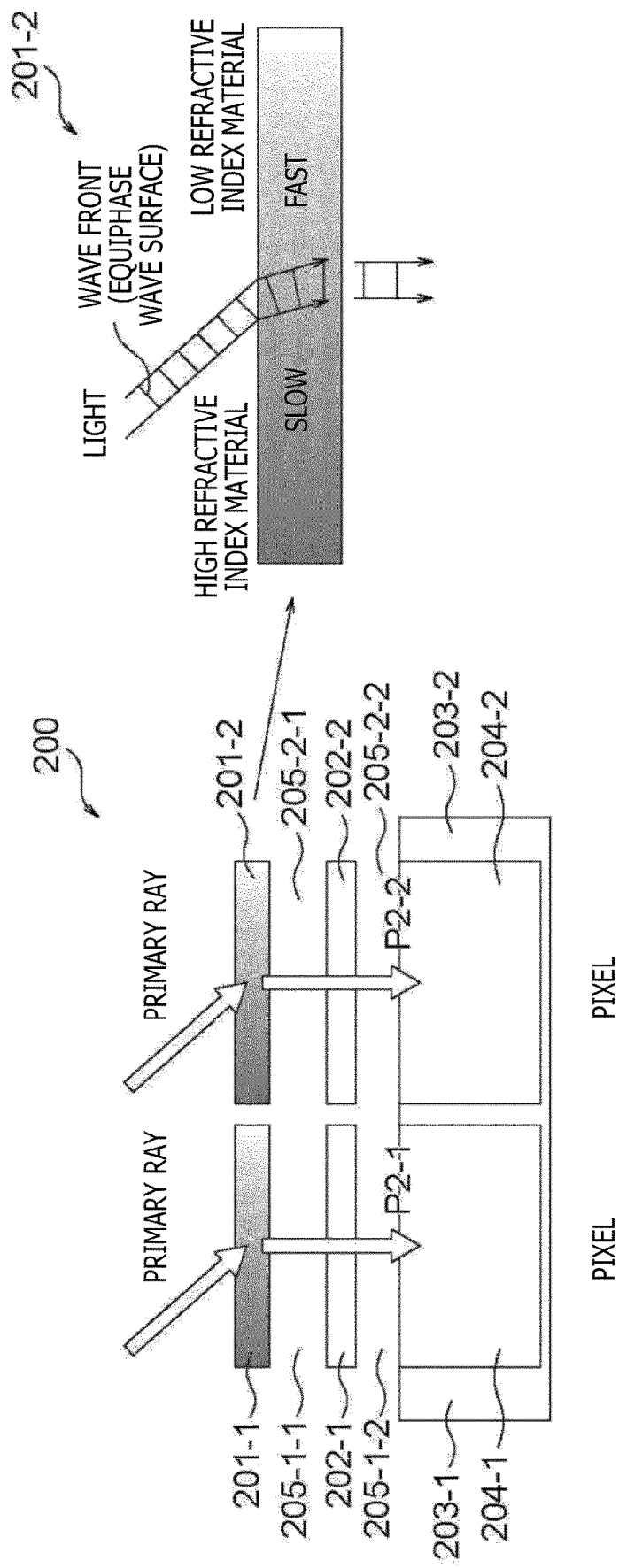
FIGS. 7A and 7B are another sectional view depicting the configuration example of the solid-state imaging device according to the present technology.

FIG. 7A is a figure depicting a sectional configuration example of a solid-state imaging device 200 of the first embodiment of the present technology. The solid-state imaging device 200 includes one functional element, one spectroscopic element, and one photodiode (PD) formed in a semiconductor substrate, in one pixel, and FIG. 7A depicts a device portion corresponding to two pixels.

In the solid-state imaging device 200, the pixel on the left side in FIG. 7A includes a functional element 201-1, an insulating film 205-1-1, a spectroscopic element 202-1, an insulating film 205-1-2, a semiconductor substrate 203-1, and a photodiode (photoelectric conversion element) 204-1 formed in the semiconductor substrate 203-1, in this order from the light incidence side. On the other hand, the pixel on the right side in FIG. 7A includes a functional element 201-2, an insulating film 205-2-1, a spectroscopic element 202-2, an insulating film 205-2-2, a semiconductor substrate 203-2, and a photodiode (photoelectric conversion element) 204-2 formed in the semiconductor substrate 203-2, in this order from the light incidence side.

The functional elements 201-1 and 201-2 are each an element having a refractive index distribution structure asymmetric in the left-right direction in FIG. 7A, and have a function of correcting a principal ray to a direction (direction of arrow P2-1 and direction of arrow P2-2) substantially perpendicular to the semiconductor substrate 203-1 or 203-2, the photodiode 204-1 or 204-2 and the spectroscopic element 202-1 or 202-2.

The details will be described using FIG. 7B. FIG. 7B is an enlarged sectional view of the functional element 201-2. As depicted in FIG. 7B, a principal ray is incident from the left side in FIG. 7B. In this case, the amount of a high refractive index material is set denser on the left side than on the right side, and, in contrast, the amount of a low refractive index material is set denser on the right side than on the left side, and the proportions of the amounts of the high refractive index material and the low refractive index material are adjusted such that the refractive index gradually varies, whereby the principal ray can be bent and corrected into a vertical direction. Note that in the case where the principal ray is incident from the right side, it is sufficient to reverse the distribution of the proportions of the amounts of the high refractive index material and the low refractive index material.

As illustrated in FIG. 7B, in the case where left and right two rays with their wave fronts aligned are incident, the ray on the left side advances slowly while the ray on the right side advances fast, so that from the necessity of coincidence of wave fronts (equiphase wave surfaces), the functional element 201-2 is designed such that during advancing of the light in the functional element 201-2, the wave from of the light is gradually bent, the advancing direction of the light is also bent, and the light advances in a substantially perpendicular direction when going out of the functional element 201-2. Note that the functional element 201-1 can also be designed similarly.

The high refractive index material and the low refractive index material can be produced, for example, by selecting from the following materials.

Zinc oxide (refractive index n=1.95)
Zirconium oxide (refractive index n=2.4)
Niobium oxide (refractive index n=2.3)
Tin oxide (refractive index n=2.0)
Tantalum oxide (refractive index n=2.1)
Hafnium oxide (refractive index n=2.0)
Titanium oxide (refractive index n=2.52)
P—SiO (refractive index n=1.45)
P—SiN (refractive index n=1.90)
P—SiON (refractive index n=1.45 to 1.90)

Note that in the foregoing, P—SiO, P—SiN, and P—SiON can be formed, for example, by a plasma CVD method at a film forming temperature of not higher than 250° C. (preferably, not higher than 200° C.) under the following conditions.

Figure 8:
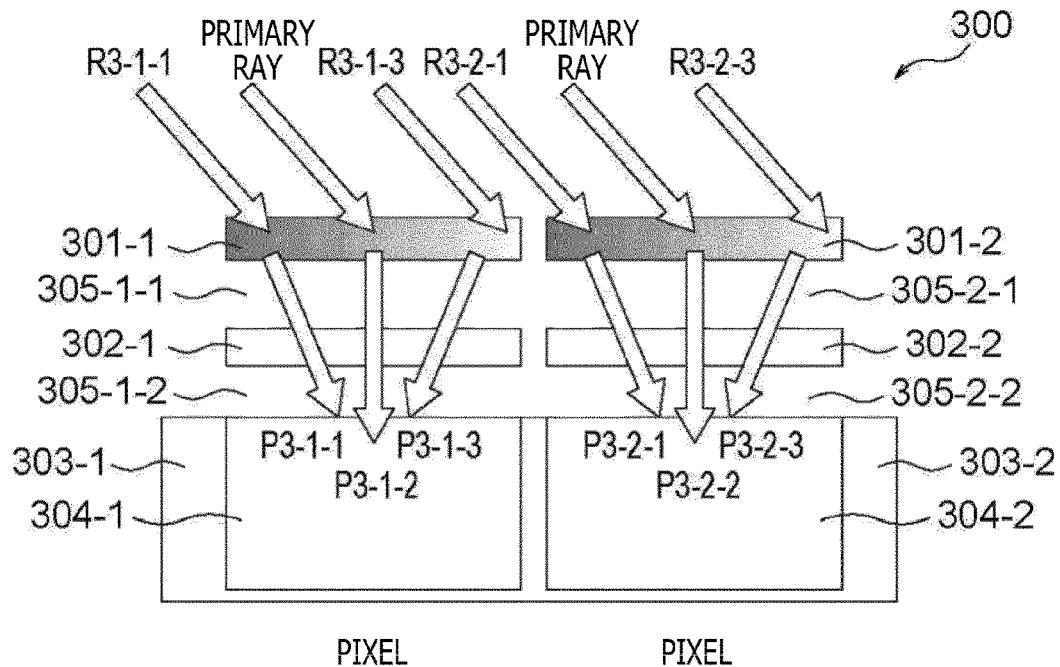
FIG. 8 is further another sectional view depicting the configuration example of the solid-state imaging device according to the present technology.

P—SiO
Kinds of film forming gases: $SiH_4$, $N_2O$, $N_2$
P—SiN
Kinds of film forming gases: $SiH_4$, $NH_3$, $N_2$
P—SiON
Kinds of film forming gases: $SiH_4$, $N_2O$, $NH_3$, $N_2$ FIG. 8 is a figure depicting a sectional configuration example of a solid-state imaging device 300 of the first embodiment of the present technology. The solid-state imaging device 300 includes one functional element, one spectroscopic element, and one photodiode (PD) formed in a semiconductor substrate, in one pixel, and FIG. 8 depicts a device portion corresponding to two pixels.

In the solid-state imaging device 300, the pixel on the left side in FIG. 8 includes a functional element 301-1, an insulating film 305-1-1, a spectroscopic element 302-1, an insulating film 305-1-2, a semiconductor substrate 303-1, and a photodiode (photoelectric conversion element) 304-1 formed in the semiconductor substrate 303-1, in this order from the light incidence side. On the other hand, the pixel on the right side in FIG. 8 includes a functional element 301-2, an insulating film 305-2-1, a spectroscopic element 302-2, an insulating film 305-2-2, a semiconductor substrate 303-2, and a photodiode (photoelectric conversion element) 304-2, in this order from the light incidence side.

The functional elements 301-1 and 301-2 are elements having a refractive index distribution structure asymmetric in the left-right direction in FIG. 8, and have a focusing function. The functional elements 301-1 and 301-2 are preferably lens elements which have an asymmetric refractive index distribution structure and have a focusing function.

As depicted in FIG. 8, by the functional elements 301-1 and 301-2, a principal ray is corrected into a direction (the direction of arrow P3-1-2 and the direction of arrow P3-2-2) substantially perpendicular to the semiconductor substrate 303-1 or 303-2, the photodiode 304-1 or 304-1, and the spectroscopic element 302-1 or 302-2. Further, by the functional elements 301-1 and 301-2, rays in the direction of arrow R3-1-1, arrow R3-1-3, arrow R3-2-1, and arrow R3-2-3 are focused to be rays in the directions of arrow P3-1-1, arrow P3-1-3, arrow P3-2-1, and arrow P3-2-3.

Figure 9:
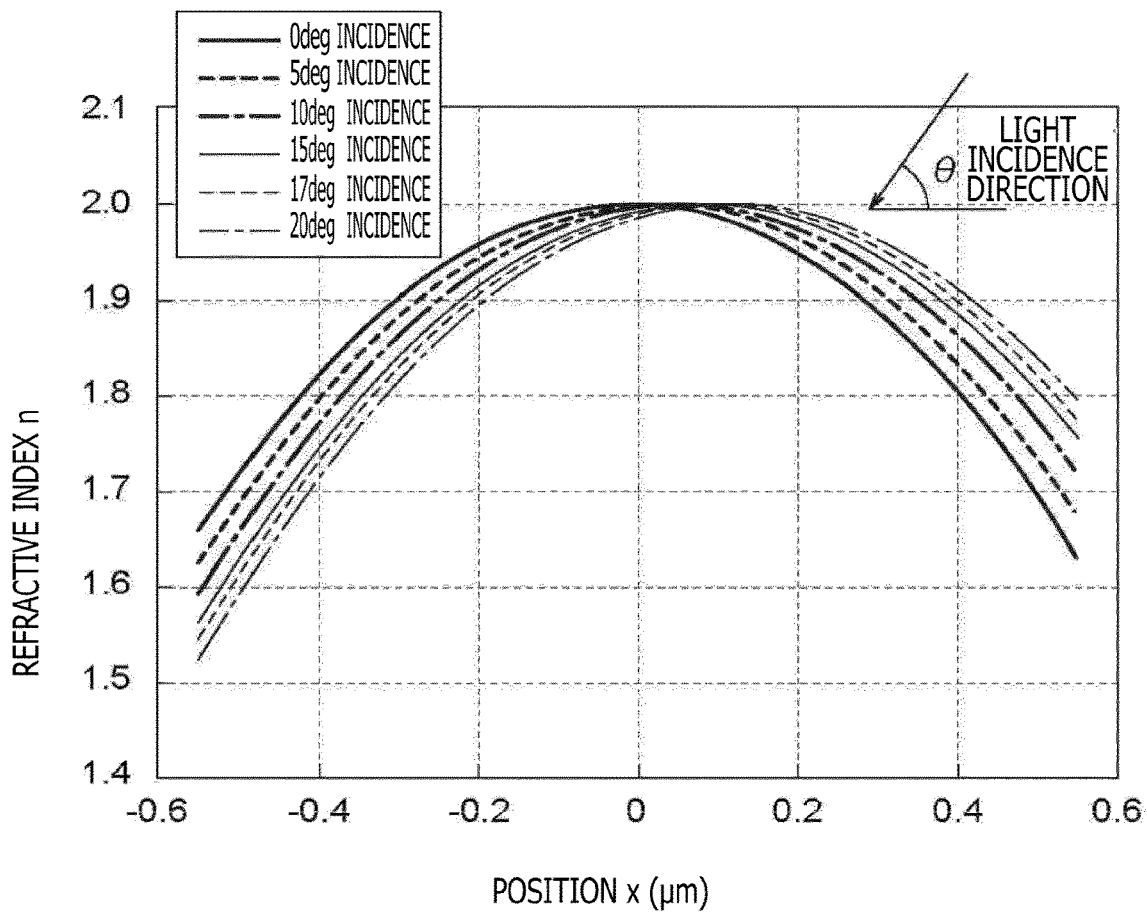
FIG. 9 is a diagram (sectional view) depicting a refractive index distribution of a functional element having a focusing function.
Figures 10A, 10B:
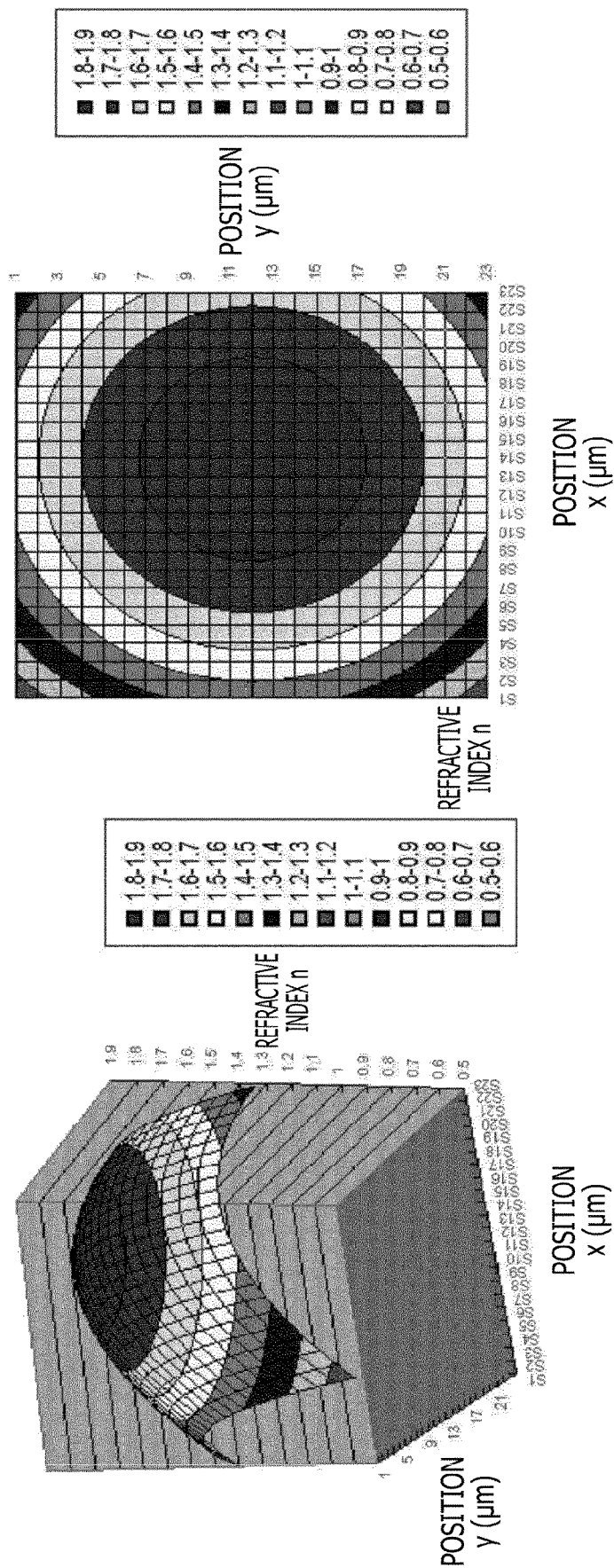
FIGS. 10A and 10B illustrate views (a bird's-eye view and a top plan view) depicting a refractive index distribution of a functional element having a focusing function.

The functional elements 301-1 and 301-2 having both a function of correcting the principal ray into the substantially perpendicular direction (correcting power) and the lens function (focusing function) preferably have a refractive index distribution illustrated in FIGS. 9, 10A and 10B. FIG. 9 is a sectional view of refractive index distribution of the functional elements 301-1 and 301-2, FIG. 10A is a bird's-eye view of the refractive index distribution of the functional elements 301-1 and 301-2, and FIG. 10B is a top plan view of the refractive index distribution of the functional elements 301-1 and 301-2. In this case, the functional elements 301-1 and 301-2 have a focusing function while correcting the principal ray, which is incident at an incidence angle θ from the right side as indicated in FIG. 9, into the perpendicular direction. As a result, the functional elements 301-1 and 301-2 have both functions of high sensitivity (focusing function) and wavelength shift reduction (correcting function).

The functional elements (for example, the functional elements 201-1 and 202-2, and 301-1 and 301-2) possessed by the solid-state imaging device of the first embodiment of the present technology have the asymmetric refractive index distribution structure, and can be produced by suitably gradually changing the composition ratio (volume ratio, weight ratio, or molar ratio) of mixing of a high refractive index material and a low refractive index material in each pixel.

FIG. 11A is a sectional view of a functional element 20 having a parallel plate carving structure, FIG. 11B is a top plan view of the functional element 20, and FIG. 11C is a perspective view of the functional element 20. As illustrated in FIGS. 11A, 11B and 11C, a refractive index distribution structure can be effectively provided by carving a high refractive index material 21 (refractive index: n1) on a wavelength order or below by lithography and etching technique, and embedding a low refractive index material 22 (refractive index: n2) in the surroundings thereof. The low refractive index material 22 (refractive index: n2) may be air.

As depicted in FIG. 11A, the volume ratio of the high refractive index material 21 (refractive index: n1) is high on the right side in FIG. 11A, and is low on the left side. In this case, a principal ray incident obliquely from the right side can be corrected into a substantially perpendicular direction.

Figure 12:
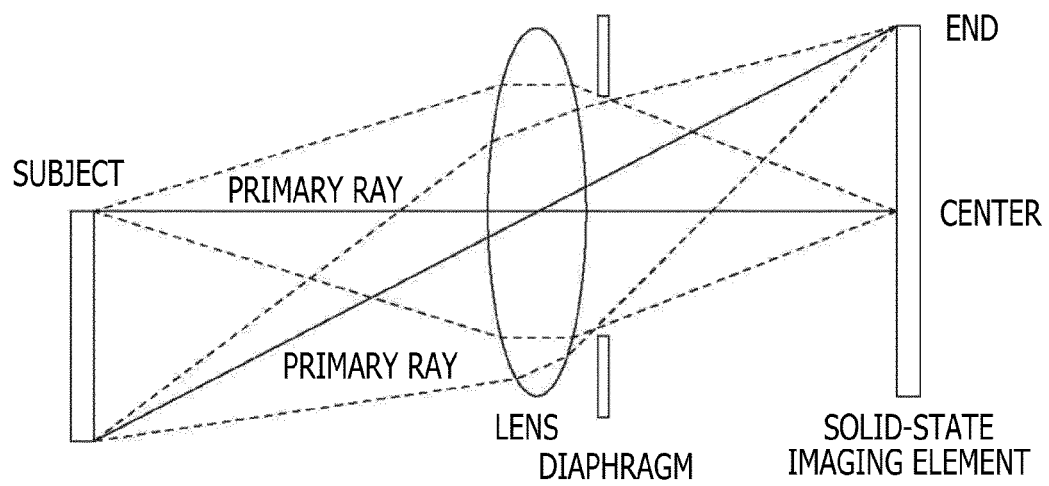
FIG. 12 is a figure depicting a camera structure.

In the case where the aforementioned effect is applied to an imaging device, since the light incidence becomes more oblique as the principal ray from an image focusing lens goes from the center toward an end of the imaging surface as depicted in FIG. 12, a higher effect is obtained when the correcting function (correcting power) of correcting the light (principal ray) from an oblique direction to a substantially perpendicular direction is set to be weaker in the vicinity of the center of the imaging surface and the correcting function (correcting power) is set to be stronger in going closer to the end of the imaging surface. In this instance, the refractive index distribution structure of each pixel is designed while raising the asymmetry level in such a manner that the refractive index increases from a lower value to a higher value, that is, the variation degree of volume ratio of the high refractive index material and the low refractive index material increases, in the direction from the center toward the end of the imaging surface.

FIGS. 13A, 13B, 13C, and 13D are top plan views of functional elements (asymmetric lens elements) 20A to 20D having both a function (correcting power) of correcting a principal ray into a substantially perpendicular direction and a focusing function.

The functional element 20A has a structure in which a high refractive index material 21A and a low refractive index material 22A have square or square ring shapes, and the whole body has an asymmetric square or square ring shape. The functional element 20B has a structure in which a high refractive index layer 21B and a low refractive index layer 22B have asymmetric circular or circular ring shapes, the width of each ring of the low refractive index material 22B is narrowed stepwise toward the lens center (the center of FIG. 13B), while the width of each ring of the high refractive index material 21B is enlarged stepwise toward the center, on the left side, with the lens center as a boundary, the width of each ring of the low refractive index material 22B is narrowed stepwise toward the center of gravity, while the width of each ring of the high refractive index material 21 B is widened stepwise toward the lens center, on the right side, and each width and variation degree differ on the left and right sides.

Figure 13A:
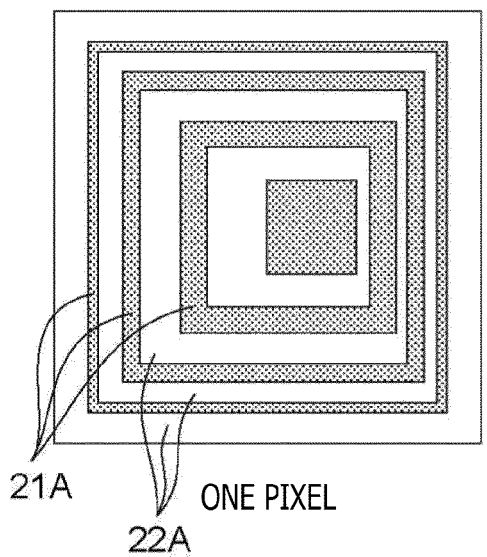
FIGS. 13A, 13B, 13C, and 13D illustrate figures depicting structures of a functional element having a focusing function.
Figure 13B:
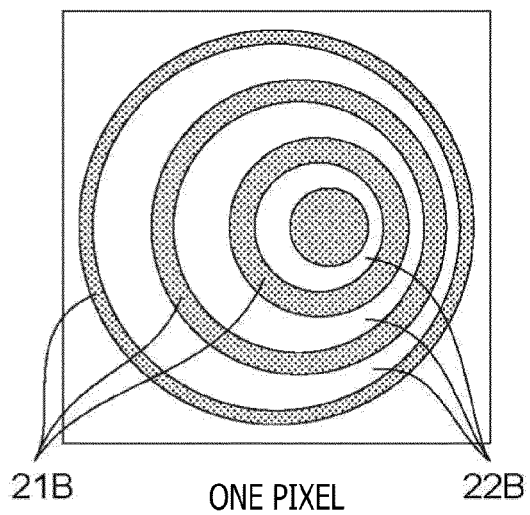
Figure 13C:
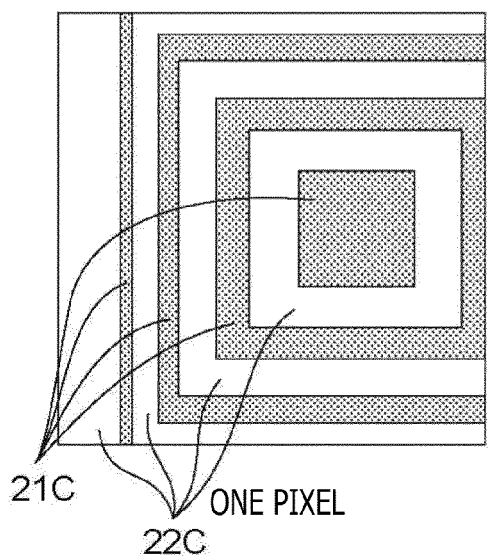
Figure 13D:
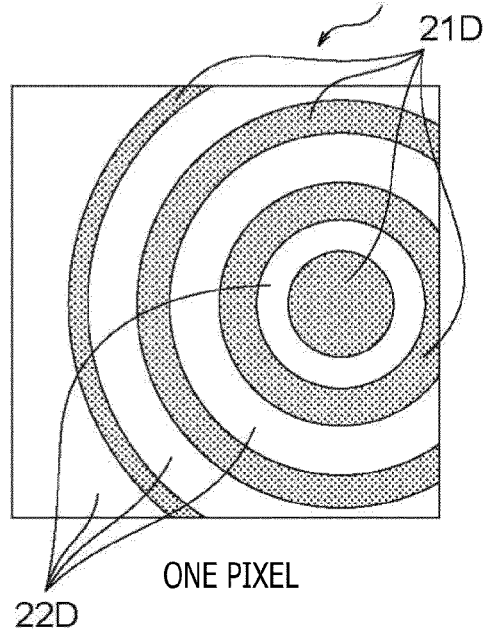

The functional element 20C has a structure in which, as compared to the plan-view layout of FIG. 13A (functional element 20A), a tetragonal low refractive index material 22C low in refractive index and a tetragonal high refractive index material 21C high in refractive index are partly lost, to fail to be annular in shape. The functional element 20D has a structure in which, as compared to the plan-view layout of FIG. 13B (functional element 20B), a circular low refractive index material 22D low in refractive index and a circular high refractive index material 21 D high in refractive index are partly lost, to fail to be annular in shape.

Like the functional elements 20A to 20D, the functional element of the solid-state imaging device of the first embodiment of the present technology may have a structure in which a layer of high refractive index is carved in a ring shape or polygonal shape such as tetragonal shape. In this instance, asymmetry is simultaneously provided, whereby a function of correcting oblique light is generated. The ring or tetragonal layout itself is staggered to obtain an asymmetric structure, like the functional elements 20A to 20D, or an originally symmetric structure may be partly cut out to obtain an asymmetric structure.

Figure 14:
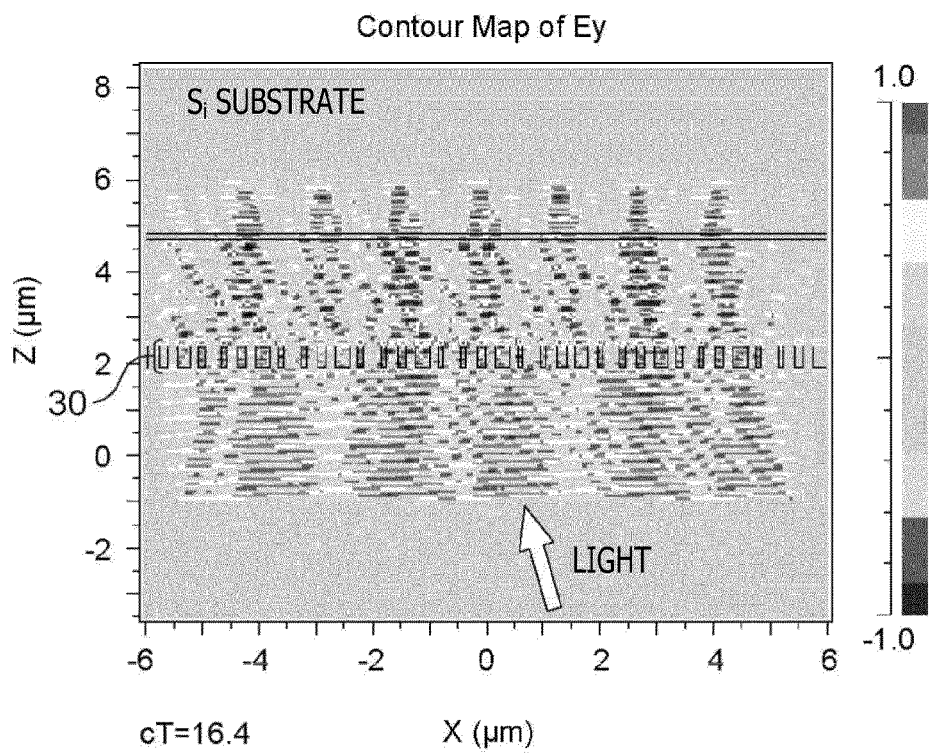
FIG. 14 is a diagram depicting the results of wave simulation.

FIG. 14 is the results of a wave simulation conducted using an FDTD (Finite-difference time-domain method) method. In FIG. 14, cT is velocity of light, c, multiplied by time T, and represents the distance (unit μm) traveled by light in vacuum. In FIG. 14, light is incident in an oblique direction from below, and it is seen that the light is focused on an Si substrate by a functional element 30 and is incident on the Si substrate substantially perpendicularly to the Si substrate.

3. Second Embodiment (Example 2 of Solid-State Imaging Device)

The solid-state imaging device of a second embodiment (Example 2 of solid-state imaging device) of the present technology is a solid-state imaging device including a functional element, a spectroscopic element, a semiconductor substrate, and a photoelectric conversion element formed in the semiconductor substrate, in which the spectroscopic element is disposed between the functional element and the photoelectric conversion element, and the functional element corrects incident light to light in a direction substantially perpendicular to the photoelectric conversion element.

In the solid-state imaging device of the second embodiment of the present technology, a plurality of pixels is arranged one-dimensionally or two-dimensionally, a functional element and a spectroscopic element are provided on the basis of at least two pixels, and a photoelectric conversion element is provided on a pixel basis.

The solid-state imaging device of the second embodiment of the present technology will be described in detail below, using FIG. 15. Note that except for the following description of the solid-state imaging device of the second embodiment of the present technology, the contents of the solid-state imaging device of the first embodiment of the present technology described above are applied, as they are, also to the solid-state imaging device of the second embodiment of the present technology.

Figure 15:
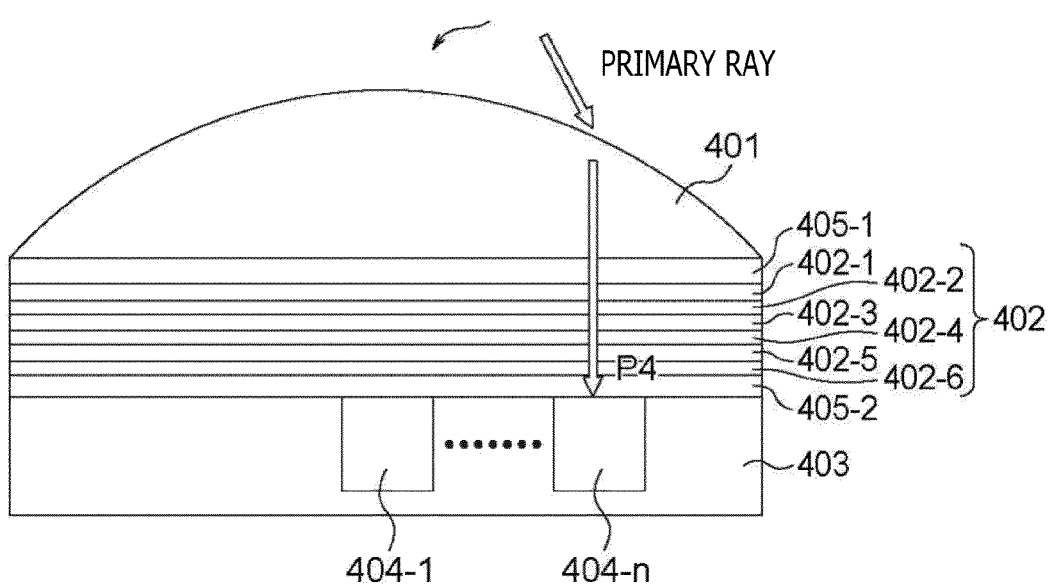
FIG. 15 is a sectional view depicting a configuration example of a solid-state imaging device according to the present technology.

FIG. 15 is a figure depicting a sectional configuration example of a solid-state imaging device 400 of the second embodiment of the present technology. The solid-state imaging device 400 includes one functional element, one spectroscopic element, and a plurality of photodiodes (PDs), in a plurality of pixels, and in FIG. 15, n photodiodes are depicted and a device portion corresponding to n pixels is illustrated.

The solid-state imaging device 400 includes a functional element 401, an insulating film 405-1, a spectroscopic element 402 including six layers of optical interference filters 402-1 to 402-6 in charge of spectroscopy, an insulating film 405-2, a semiconductor substrate 403, and n photodiodes (404-1 to 404-$n$) formed in the semiconductor substrate 403, in this order from the light incidence side. Note that n is an integer of not less than 2. The functional element 401 is a transparent substrate having a curved surface shape. The transparent substrate may include a transparent glass, or may include a transparent resin.

When a principal ray is incident on the functional element 401 from an oblique direction, the ray is incident while being corrected into a direction (direction of arrow P4) substantially perpendicular to the photodiodes (404-1 to 404-$n$) and the spectroscopic element 402, by refraction according to the Snell's law ($n_1.\sin\theta_1 = n_2.\sin\theta_2$) at the interface between a curved surface of the transparent substrate possessed by the functional element 401 and air. In this case, in the center of the imaging surface, the light is incident on the spectroscope while remaining substantially perpendicular. As an end of the imaging surface is approached, on the other hand, the incidence angle is enlarged, and the light is refracted more largely according to the Snell's law, whereby the light is incident on the spectroscopic element 402 while being corrected into a substantially perpendicular direction. Since the incidence angle is increased and the light is refracted more largely according to the Snell's law, as the end of the imaging surface is approached, the correcting power (correcting function) of correcting the light incident from an oblique direction into the substantially perpendicular direction is increased, so that the same spectral characteristics can be obtained throughout the image surface (at any place of the image surface).

The spectroscopic element 402 may mainly have a structure like a spectroscopic element 602 depicted in FIG. 17A, and may have a function of cutting mainly infrared light, or may have a structure of transmitting only a certain wavelength by the spectroscopic element (Fabry-Perot resonator) 10 depicted in FIG. 1A. It is to be noted, however, that in this case a filter for cutting visible light is separately needed.

4. Third Embodiment (Example of Electronic Apparatus)

An electronic apparatus of a third embodiment (example of electronic apparatus) of the present technology is an electronic apparatus including the solid-state imaging device of the first embodiment or the second embodiment of the present technology. The solid-state imaging device of the first embodiment or the second embodiment of the present technology is as above-described, and, therefore, description thereof is omitted here. The electronic apparatus of the third embodiment of the present technology includes the solid-state imaging device of the first embodiment or the second embodiment of the present technology which device is enhanced in reliability and image quality, and, therefore, it is possible to realize enhancement of the performance of the electronic apparatus of the third embodiment of the present technology.

Figure 27:
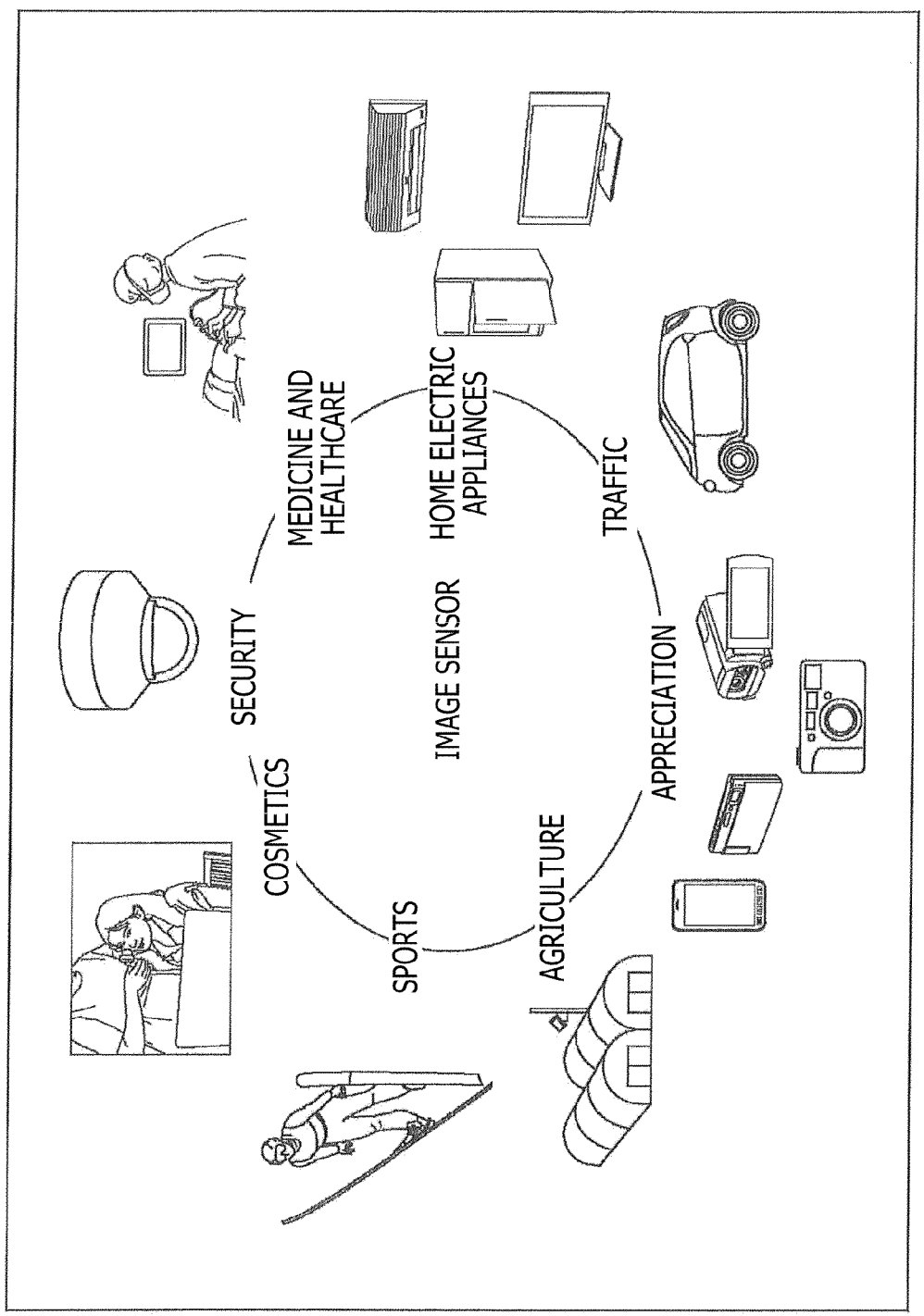
FIG. 27 is a figure depicting use examples of the solid-state imaging device according to the present technology.

5. Use Examples of Solid-State Imaging Device According to the Present Technology FIG. 27 is a figure depicting use examples for which the solid-state imaging device according to the present technology described above is to be used. The solid-state imaging device according to the present technology mentioned above can be used, for example, in various cases of sensing light such as visible light, infrared light, ultraviolet light, and X-rays, as mentioned below.

Apparatuses that pick up an image for appreciation (viewing) use, such as digital cameras, portable apparatuses equipped with a camera function, etc.

Apparatuses for use in traffic use, such as in-vehicle sensors for imaging the front side, the rear side, the surroundings, the interior, etc. of an automobile for the purpose of safe driving, such as automatic vehicle stop, recognition of the driver's condition, etc., monitor cameras for monitoring the running vehicles and/or the road, distance measuring sensors for measuring distances such as inter-vehicle distance, etc.

Apparatuses for use in home electric appliances such as TVs, refrigerators and air conditioners for the purpose of imaging a user's gesture and performing an apparatus operation according to the gesture.

Apparatuses for use in medical or healthcare use, such as endoscopes and devices for imaging blood vessels by receiving infrared light.

Apparatuses for security use, such as surveillance camera for crime prevention and cameras for person authentication (biometrics authentication).

Apparatuses for cosmetic use, such as skin measuring instrument for imaging a skin and a microscope for imaging the scalp.

Apparatuses for sports use, such as action cameras and wearable cameras for sports use or the like.

Apparatuses for agricultural use, such as cameras for monitoring conditions of fields and/or farm products.

EXAMPLES

An effect of the present technology will be specifically described below by depicting Examples. Note that the scope of the present technology is not to be limited by the Examples.

Example 1

Figure 16:
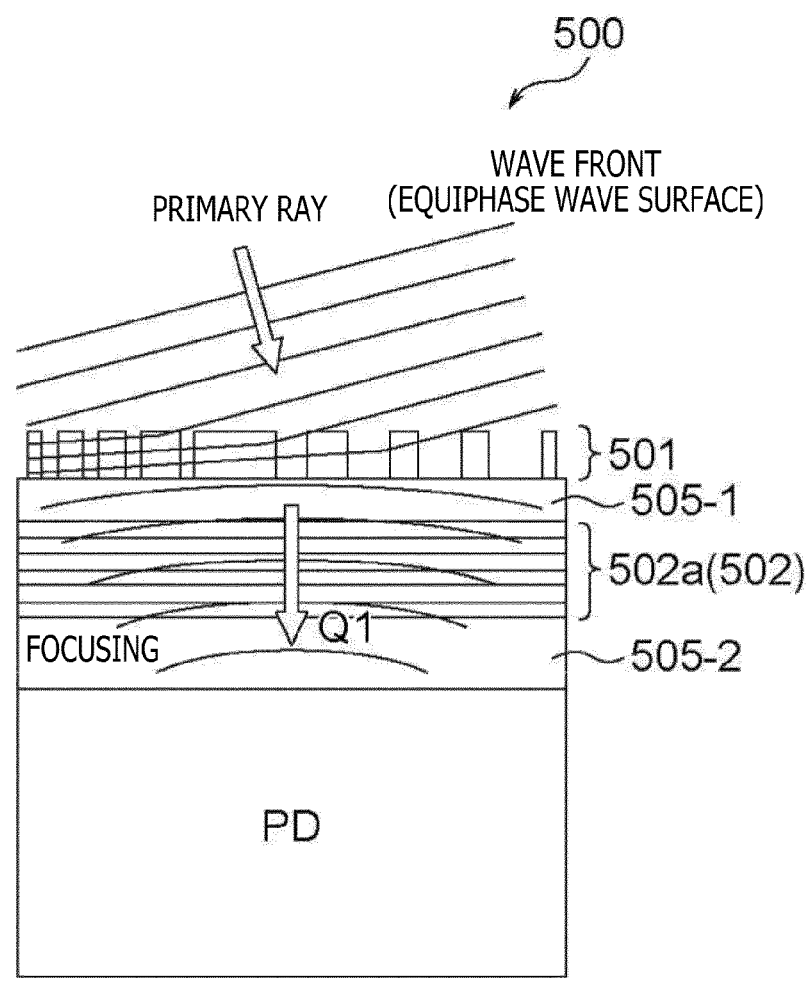
FIG. 16 is a diagram depicting a sectional configuration of a solid-state imaging device of Example 1 of the present technology.

A solid-state imaging device 500 used in Example 1 is depicted in FIG. 16. FIG. 16 is a figure depicting a sectional configuration of the solid-state imaging device 500. The solid-state imaging device 500 includes one functional element 501, one spectroscopic element 502, and one photodiode (PD), in one pixel, and FIG. 16 depicts a device portion corresponding to one pixel.

As illustrated in FIG. 16, the solid-state imaging device 500 includes, over (on the upper side in FIG. 16 of) one photodiode (PD), a spectroscopic element 502 including a plurality of optical interference filters 502a (multilayer film) having a spectroscopic function, and a functional element 501 having an asymmetric refractive index distribution structure by which a principal ray obliquely incident on the spectroscopic element 502 is corrected into a substantially perpendicular direction (arrow Q1 direction) and which has a focusing function. Besides, an insulating film 505-1 is disposed between the functional element 501 and the spectroscopic element 502, and an insulating film 505-2 is disposed between the spectroscopic element 502 and the photodiode (PD). As the functional element 501, specifically, there can be used, for example, the functional elements 20A to 20D depicted in FIGS. 13A, 13B, 13C, and 13D. Note that while the functional element having the focusing function is used here, a functional element 20 which has only a function of bending the principal ray to a substantially perpendicular direction but does not have a focusing function as depicted in FIGS. 11A, 11B, and 11C may be used. In that case, an on-chip lens (OCL) may be provided separately.

A solid-state imaging device 600 used in Example 1 is depicted in FIG. 17A. FIG. 17A is a figure depicting a sectional configuration of the solid-state imaging device 600. The solid-state imaging device 600 includes, disposed on an Si substrate, a spectroscopic element 602 which includes an AR film, a substrate 606-2, a plurality of optical interference filters 602a (multilayer film), and a substrate 606-1, stacked in this order. In the Si substrate, at least one photodiode (PD) (not illustrated) is formed. In addition, a functional element (not illustrated) is stacked over (on the upper side in FIG. 17A of) the substrate 606-1. The spectroscopic element 602 mainly has a function of cutting infrared light, and a transmission optical spectrum of the spectroscopic element 602 is depicted in FIG. 17B. In the graph of FIG. 17B, the axis of ordinates is transmittance (T), and the axis of abscissas is wavelength (A) (nm). As illustrated in FIG. 17B, by the spectroscopic element 602 having the function of cutting infrared light, the transmittance is made to be substantially 0 (zero) on the longer wavelength side than approximately 700 nm.

A certain wavelength may only be transmitted by use of the spectroscopic element (Fabry-Perot resonator) 10 depicted in FIG. 1A. It is to be noted, however, that in this case, a filter for cutting visible light may be needed separately.

Figure 18B:
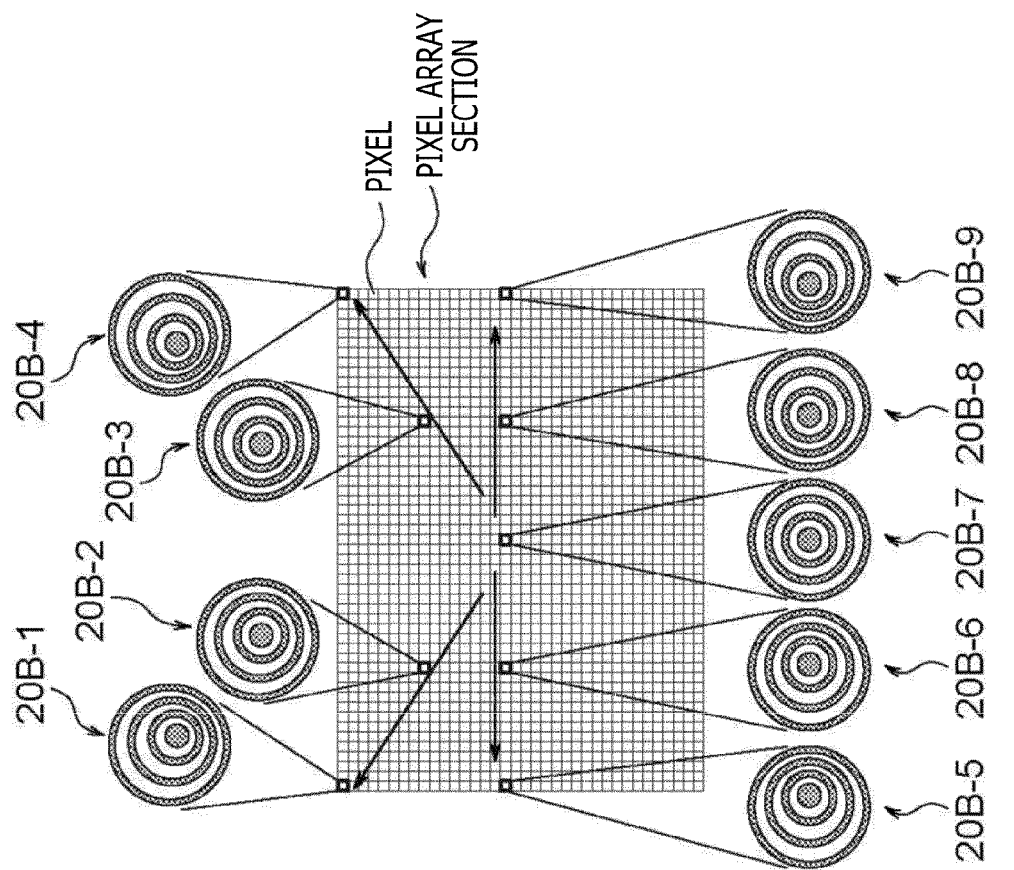
FIGS. 18A and 18B illustrate diagrams depicting an arrangement of functional elements on an imaging surface.
Figure 18A:
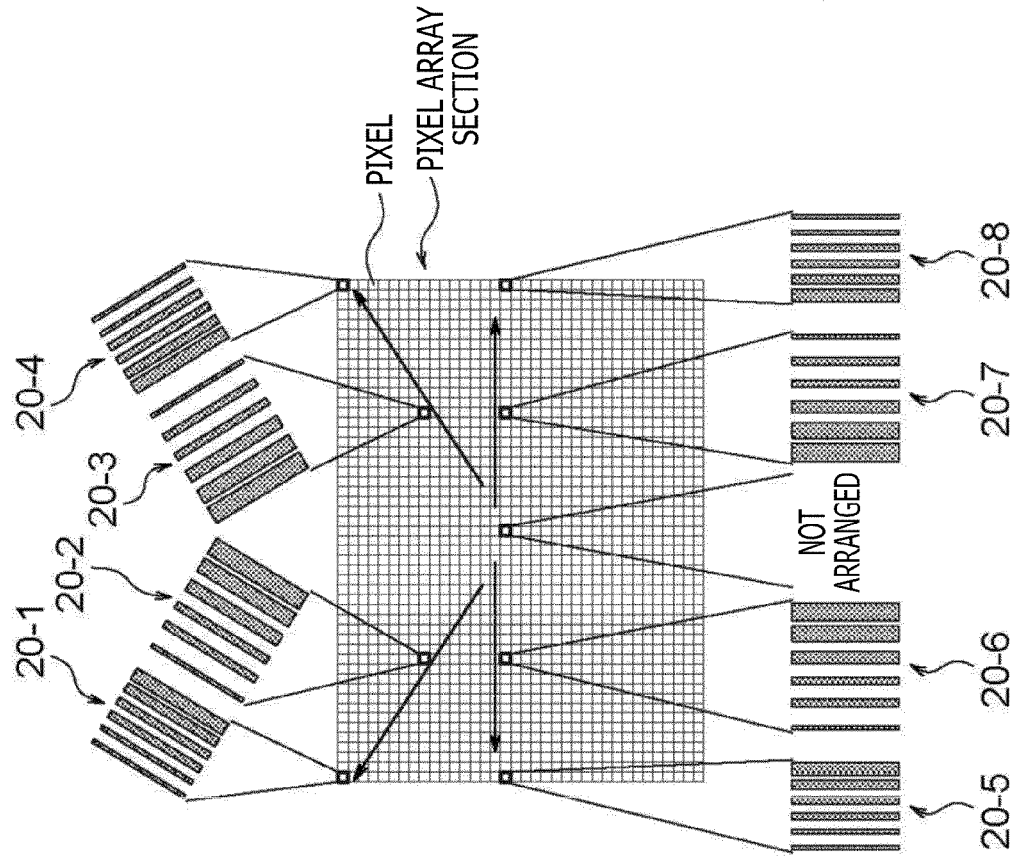

FIG. 18A is a figure depicting a layout of functional elements 20-1 to 20-8 having an asymmetric refractive index distribution structure, on an imaging surface. Note that the functional elements 20-1 to 20-8 do not have a focusing function. FIG. 18B is a figure depicting a layout on an imaging surface of functional elements 20B-1 to 20B-9 having an asymmetric refractive index distribution structure, on an imaging surface. The functional elements 20B-1 to 20B-9 have a focusing function.

As illustrated in FIGS. 18A, and 18B, by varying the structure according to the image height on the imaging surface, the principal ray incident obliquely can be optimally corrected into the substantially perpendicular direction, to be incident on the spectroscopic element. With the structure of each functional element (20-1 to 20-8, or 20B-1 to 20B-9) thus varied according to the image height, an accurate correction can be made in response to variation in incidence angle of the principal ray due to image height. As a result, spectroscopy becomes equal for all the image surface.

As a method of producing a functional element, a spectroscopic element including a multilayer film or the like is preliminarily produced over a semiconductor substrate or the like, a high refractive index material is vapor deposited on the spectroscopic element by CVD or the like, and the shape of the functional element is formed by a lithography technique for a resist and an etching technique, whereby the functional element is produced. A low refractive index material may further be embedded in the thus produced functional element.

A specific production process of a functional element will be described using FIGS. 19A, 19B, 19C, 19D, 19E, and 19F.

First, as depicted in FIG. 19A, a high refractive layer 2100 is vapor deposited on a spectroscopic element 3000 (or it may be a semiconductor substrate 3000) by CVD, and, next, as depicted in FIG. 19B, a resist layer 4000 is formed on the high refractive layer 2100 (resist coating).

Then, exposure (for example, pattern exposure) and development (FIG. 19C) are performed, followed by RIE (Reactive Ion Etching) processing (FIG. 19D).

Finally, the resist layer 4000 is removed (FIG. 19E), whereby a functional element (for example, a functional element having an asymmetric refractive index distribution structure) is produced. A low refractive material 2200 may be embedded in the thus produced functional element by coating or a CVD method, to produce a functional element including the high refractive material and the low refractive material (FIG. 19F).

Example 2

A solid-state imaging device 700 used in Example 2 is illustrated in FIG. 20. FIG. 20A is a figure depicting a sectional configuration of the solid-state imaging device 700. The solid-state imaging device 700 includes one functional element 701, one spectroscopic element 702 including a plurality of optical interference filters 702a (multilayer film), and one photodiode (PD), in one pixel, and FIG. 20A depicts a device portion corresponding to one pixel. FIG. 20B is a figure (top plan view) depicting an imaging surface 700d (an xy surface in FIG. 20B) of the solid-state imaging device 700. As depicted in FIG. 20B, a plurality of pixels 7000 is arranged two-dimensionally in xy directions.

As illustrated in FIG. 20A, in the solid-state imaging device 700, a spectroscopic element 702 including a multilayer film having a spectroscopic function is provided over (on the upper side in FIG. 20A of) one photodiode (PD), and a functional element 701 having an asymmetric refractive index distribution structure which corrects an obliquely incident principal ray into a substantially perpendicular direction (arrow Q2 direction) and has a focusing function is provided thereover. The functional element 701 is a lens element, and the functional element 701 includes a high refractive material 721 and a low refractive material 722. As depicted in FIG. 20B, the low refractive material 722 is disposed in the surroundings of the high refractive material 721, on the basis of each pixel 7000. By this layout configuration, the refractive index distribution structure of the functional element 701 is formed to be asymmetric. Besides, as illustrated in FIG. 20A, an insulating film 705-1 is disposed between the functional element 701 and the spectroscopic element 702, and an insulating film 705-2 is disposed between the spectroscopic element 702 and the photodiode (PD).

The functional element 701 can be produced by a process in which the spectroscopic element 702 including a multilayer film or the like is preliminarily produced over a semiconductor substrate or the like, a high refractive index material is vapor deposited on the spectroscopic element 702 by CVD or the like as depicted in FIGS. 19A, 19B, 19C, 19D, 19E, and 19F, then the shape is conditioned by lithography and etching technique, a low refractive index material is further embedded, and the low refractive index material is again curved by a lithography technique for a resist and an etching technique, such that the low refractive material 722 is disposed in the surroundings of the high refractive material 721. In addition, in the functional element 701 having the asymmetric refractive index distribution structure, with the structure varied according to the image height on an imaging surface 700d, as depicted in FIG. 20B, an obliquely incident principal ray can be corrected into a substantially perpendicular direction and be incident on the spectroscopic element 702.

With the structure of the functional element 701 thus varied according to the image height and on the basis of each pixel (on a pixel 7000 basis), the correcting power can be varied flexibly according to variation in the incidence angle of the principal ray with the image height, and accurate correction can be achieved. As a result, the optical spectrum becomes equal for all the image surface. Further, the spectroscopic element 702 may be structured like the spectroscopic element 602 depicted in FIG. 17A, to have a function of cutting mainly infrared light, or may be structured to transmit only a certain wavelength by the spectroscopic element (Fabry-Perot resonator) 10 depicted in FIG. 1A. It is to be noted, however, that in this case, a filter for cutting visible light is needed separately.

Figures 21A, 21B:
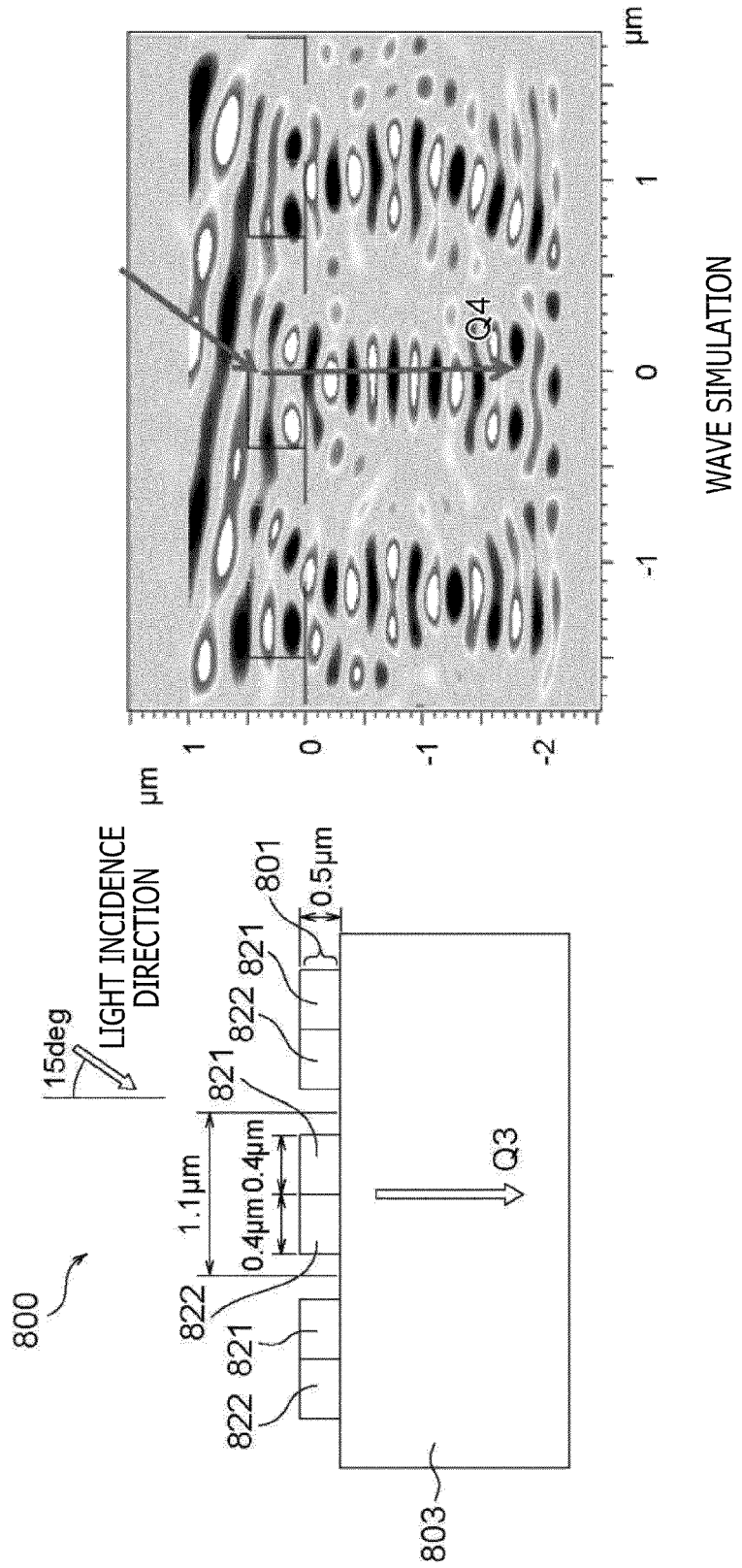
FIGS. 21A and 21B illustrate figures depicting wave simulation results.

Experimental results of a wave simulation are depicted in FIGS. 21A and 21B. FIG. 21A is a figure depicting a sectional configuration of a solid-state imaging device 800 used in the wave simulation experiment. The solid-state imaging device 800 includes a functional element 801, and a transparent film 803 (for example, an oxide film, etc.) disposed under (on the lower side in FIG. 21A of) the functional element 801, and, though not illustrated, a spectroscopic element is provided under (on the lower side in FIG. 21A of) the transparent film 803, and a photodiode is provided under (on the lower side in FIG. 21A of) the spectroscopic element. As the functional element 801, three sets of functional elements each including a low refractive material 822 and a high refractive material 821 disposed alternately in the transverse direction (the left-right direction in FIG. 21A) are provided and depicted in FIG. 21A. The refractive index (n) of the high refractive material 821 is 1.6 to 1.9, whereas the refractive index (n) of the low refractive material 822 is 1.45, and the refractive index (n) of the transparent film 803 is 1.45. The length in the longitudinal direction (the vertical direction in FIG. 21A) of each of one high refractive material 821 and the low refractive material 822 is 0.5 μm, and the length in the transverse direction (the left-right direction in FIG. 21A) thereof is 0.4 μm. The solid-state imaging device 800 may include a total of three spectroscopic elements on the basis of one functional element, or may include one spectroscopic element per three sets of functional elements. In addition, the solid-state imaging device 800 may include a total of three photodiodes (corresponding to three pixels) on the basis of one functional element, or may include one photodiode (corresponding to one pixel) per three sets of functional elements.

FIG. 21B is data denoting the experimental results of a wave simulation. In the data of FIG. 21B, the axis of ordinates is the size (μm) in the longitudinal direction of the transparent film 803, and the axis of abscissas is the size (μm) in the transverse direction of the transparent film 803.

As illustrated in FIG. 21A, obliquely incident light (incidence angle: 15 deg, wavelength: 550 nm) is corrected into a substantially perpendicular direction.

This was verified, that is, it was verified that the obliquely incident light (incidence angle: 15 deg, wavelength: 550 nm) is corrected into a substantially perpendicular direction (arrow Q4 direction) by the actual wave simulation data, as illustrated in FIG. 21B.

Example 3

Figures 22A, 22B:
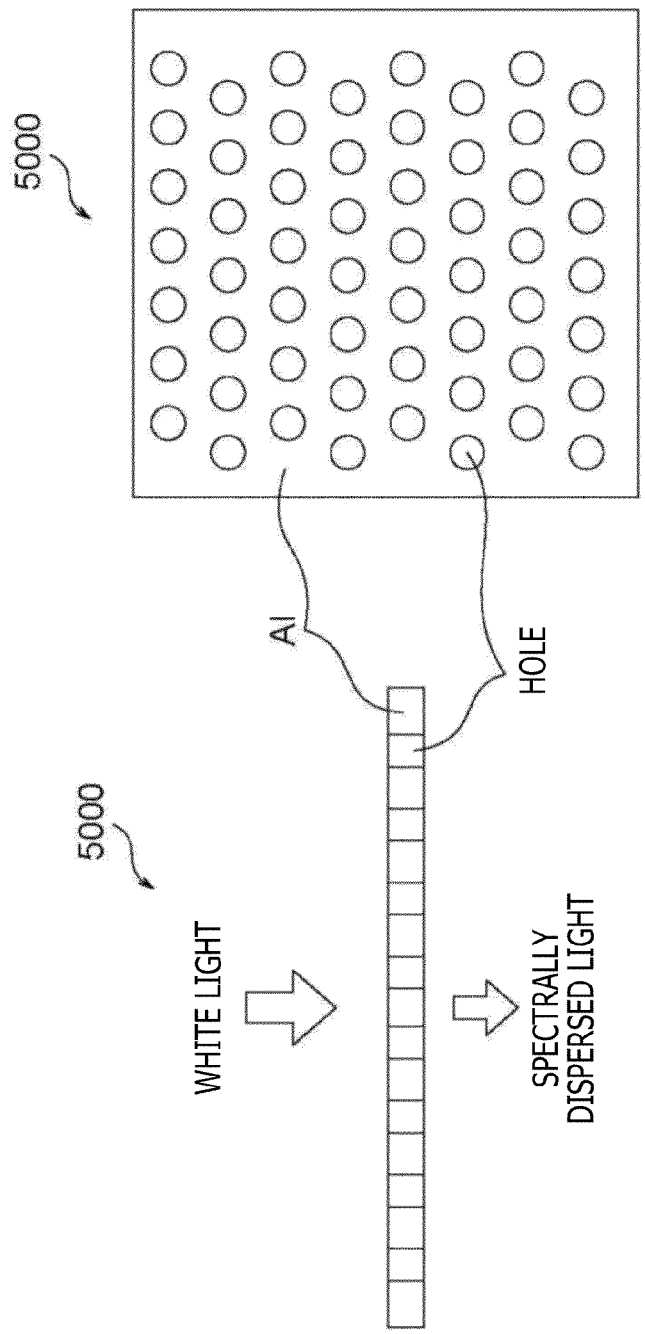
FIGS. 22A and 22B illustrate a sectional view and a top plan view of a spectroscopic element including a metallic film having a hole array structure, which is provided in a solid-state imaging device of Example 3 of the present technology.

In Example 3, a spectroscopic element having a structure using an abnormal transmission phenomenon due to surface plasmon resonance of a metal will be described. FIG. 22A is a sectional view of a metallic film 5000 which has a hole array structure and which is provided in a spectroscopic element, and FIG. 22B is a top plan view of the metallic film 5000. The metallic film 5000 is a film in which a multiplicity holes are periodically opened in an aluminum film having a thickness of up to 150 nm. The metallic film 5000 may be a gold (Au) film, a silver (Ag) film or the like, other than the aluminum (Al) film.

When white light is incident on the metallic film 5000, specified light is transmitted through the metallic film 5000 depending on the periodic pattern. For example, where the period is up to 250 nm, spectral characteristics as depicted in FIG. 5 are obtained. Like in the case of a spectroscopic element including a plurality of optical interference filters (multilayer film), shifting and broadening of a peak wavelength of oblique light occur, and spectrum shape is varied. Therefore, a spectroscopic element including the metallic film 5000 may be disposed, in place of the spectroscopic element including the multilayer film or the Fabry-Perot resonator of Examples 1 and 2 and Example 4 which will be described later. In other words, a spectroscopic element including the metallic film 5000 may be present over each pixel, and, further, an asymmetric refractive index dispersing element (functional element) may be disposed thereover. In addition, where a principal ray incident obliquely according to the image height is corrected to be incident perpendicularly to the spectroscopic element including the metallic film 5000 on the basis of the imaging surface as a whole, the same spectral characteristics are thereby obtained throughout the imaging surface.

Note that the spectroscopic element including the metallic film 5000 has only one layer of aluminum (Al) film (a gold (Au) film or a silver (Ag) film may also be used), and, therefore, its production process is easy, and productivity and mass-productivity are good. Besides, there is a merit on a cost basis.

Example 4

Figures 23A, 23B, 23C:
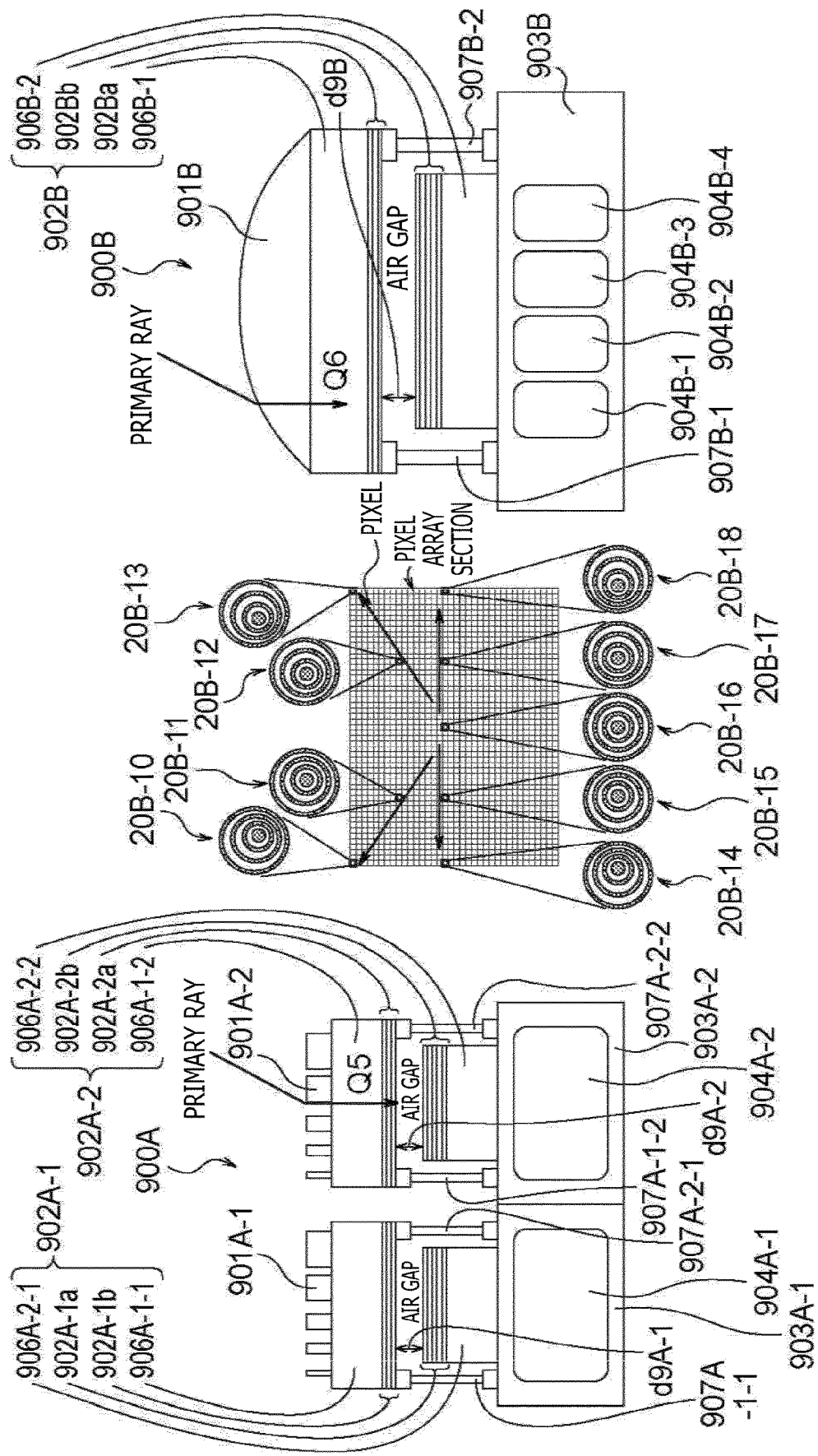
FIGS. 23A, 23B, and 23C illustrate figures (a top plan view and sectional views) depicting a configuration example of a solid-state imaging device of Example 4 of the present technology.

Solid-state imaging devices 900A and 900B used in Example 4 are depicted respectively in FIGS. 23A and 23C. FIG. 23A is a figure depicting a sectional configuration of the solid-state imaging device 900A. FIG. 23C is a figure depicting a sectional configuration of the solid-state imaging device 900B. FIG. 23B is a figure depicting the layout on an imaging surface of functional elements 20B-10 to 20B-18 having an asymmetric refractive index distribution structure, on the imaging surface of the solid-state imaging device 900A. Functional elements 20B-1 to 20B-9 have a focusing function.

Solid-State Imaging Device 900A

First, the solid-state imaging device 900A will be described.

The solid-state imaging device 900A includes one functional element, one spectroscopic element, and one photodiode (PD), in one pixel, and FIG. 23A depicts a device portion corresponding to two pixels.

The solid-state imaging device 900A includes a functional element 901A-1, and a spectroscopic element 902A-1 (the spectroscopic element on the left side in FIG. 23A), in this order from the light incidence side, in which the spectroscopic element 902A-1 includes a plurality of optical interference filters (also referred to as a dielectric material multilayer film or a reflective multilayer film) 902A-1a and 902A-1b which is disposed oppositely and which is in charge of spectroscopy, an air gap between the optical interference filters 902A-1a and 902A-1b, and substrates 906A-1-1 and 906A-2-1.

In addition, the solid-state imaging device 900A includes a functional element 901A-2, and a spectroscopic element 902A-2 (the spectroscopic element on the right side in FIG. 23A), in this order from the light incidence side, in which the spectroscopic element 902A-2 includes a plurality of optical interference filters (also referred to as a dielectric material multilayer film or a reflective multilayer film) 902A-2a and 902A-2b which is disposed oppositely and which is in charge of spectroscopy, an air gap between the optical interference filters 902A-2a and 902A-2b, and substrates 906A-1-2 and 906A-2-2.

A wavelength variable device provided in the solid-state imaging device 900A includes the spectroscopic element 902A-1 on the left side in FIG. 23A, and distance variable devices 907A-1-1 and 907A-2-1. In addition, the wavelength variable device provided in the solid-state imaging device 900A includes the spectroscopic element 902A-2 on the right side in FIG. 23A, and distance variable devices 907A-1-2 and 907A-2-2. In other words, the solid-state imaging device 900A includes the wavelength variable device on a pixel basis, and, in FIG. 23A, it includes two wavelength variable devices corresponding to two pixels.

In the air gap on the left side in FIG. 23A, a distance d9A-1 of the air gap can be varied by use of the distance variable devices 907A-1-1 and 907A-2-1. In addition, in the air gap on the right side in FIG. 23B, a distance d9A-2 of the air gap can be varied by use of the distance variable devices 907A-1-2 and 907A-2-2. As the distance variable devices 907A-1-1 and 907A-2-1, and 907A-1-2 and 907A-2-2, there can be used piezoelectric element such as piezo elements, and MEMS elements.

In the solid-state imaging device 900A, a lower layer (the lower side in FIG. 23A) of the wavelength variable device includes a total of two photodiodes (PDs) 904A-1 and 904A-2 formed respectively in semiconductor substrates 903A-1 and 903A-2 and semiconductor substrates 904A-1 and 904A-2, as a device portion corresponding to two pixels. Note that, though not illustrated, in the solid-state imaging device 900A, a wiring layer is formed in a lower layer (the lower side in FIG. 18A) of the semiconductor substrates 903A (903A-1 and 903A-2).

In the solid-state imaging device 900A, the incidence angle of a principal ray incident on each pixel from an oblique direction is bent by use of the functional elements 901A-1 and 901A-2 (lens elements) having an asymmetric refractive index distribution structure, and the light of the principal ray is incident on each pixel in a substantially perpendicular direction (Q5 direction in FIG. 23A). By this, shifting toward the shorter wavelength side can be reduced. By producing the functional elements 901A-1 and 901A-2 (lens elements) on a digital basis by use of the lithography and etching technique as depicted in FIGS. 19A, 19B, 19C, 19D, 19E, and 19F, functional elements (asymmetric lens elements) asymmetric in effective refractive index can be formed in an upper portion (over the spectroscopic elements 902A-1 and 902A-2 in FIG. 23A) of the solid-state imaging device 900A. As a result, the ray can be bent into a direction substantially perpendicular to the light-receiving surfaces (surfaces on the light-receiving surface side of the semiconductor substrates 903A (903A-1 and 903A-2)) of the photodiodes (PDs) 904A-1 and 904A-2.

Solid-State Imaging Device 900B

A solid-state imaging device 900B will be described below.

The solid-state imaging device 900B includes one functional element, one spectroscopic element, and four photodiodes (PDs), in four pixels, and FIG. 23C depicts a device portion corresponding to four pixels.

The solid-state imaging device 900B includes a functional element 901B, and a spectroscopic element 902B, in this order from the light incidence side, in which the spectroscopic element 902B includes a plurality of optical interference filters (also referred to as a dielectric material multilayer film or a reflective multilayer film) 902Ba and 902Bb which is disposed oppositely and which is in charge of spectroscopy, an air gap between the optical interference filters 902Ba and 902Bb, and substrates 906B-1 and 906B-2. The functional element 901B is a transparent substrate having a curved surface shape. The transparent substrate can be produced from a transparent glass or a transparent resin.

A wavelength variable device provided in the solid-state imaging device 900B includes the spectroscopic element 902B and distance variable devices 907B-1 and 907B-2. In other words, as depicted in FIG. 23C, the solid-state imaging device 900B includes one wavelength variable device per four pixels.

In the air gap in FIG. 23C, a distance d9B of the air gap can be varied by use of the distance variable devices 907B-1 and 907B-2. As the distance variable devices 907B-1 and 907B-2, there can be used piezoelectric elements such as piezo elements, and MEMS elements.

In the solid-state imaging device 900B, a lower layer (the lower side in FIG. 23C) of the wavelength variable device includes a total of four photodiodes (PDs) 904B-1 to 904B-4 formed in a semiconductor substrate 903B, as a device portion corresponding to four pixels. Note that, though not illustrated, in the solid-state imaging device 900B, a wiring layer is formed in a lower layer (the lower side in FIG. 23C) of the semiconductor substrate 903B.

As aforementioned, the solid-state imaging device 900B has a structure in which the functional element 901B being a transparent substrate having a convex surface of a lens shape is adhered to an upper portion (the upper side in FIG. 23C). There is provided a function of bending an obliquely incident ray (mainly, a principal ray) into a direction (arrow Q6 direction) substantially perpendicular to light-receiving surfaces (the surfaces on the light-receiving surface side of the semiconductor substrate 903B) of the photodiodes (PDs) 904B-1 to 904B-4, by utilizing refraction according to the Snell's law at the interface between the transparent substrate (functional element 901 B) and air. Though the incidence angle of the principal ray is enlarged at a position which is spaced from an optical axis of an image focusing lens and at which the image height is large, the principal ray can be bent into the substantially perpendicular direction by enlarging the inclination of the surface of the transparent substrate (functional element 901 B).

Example 5

Figure 24:
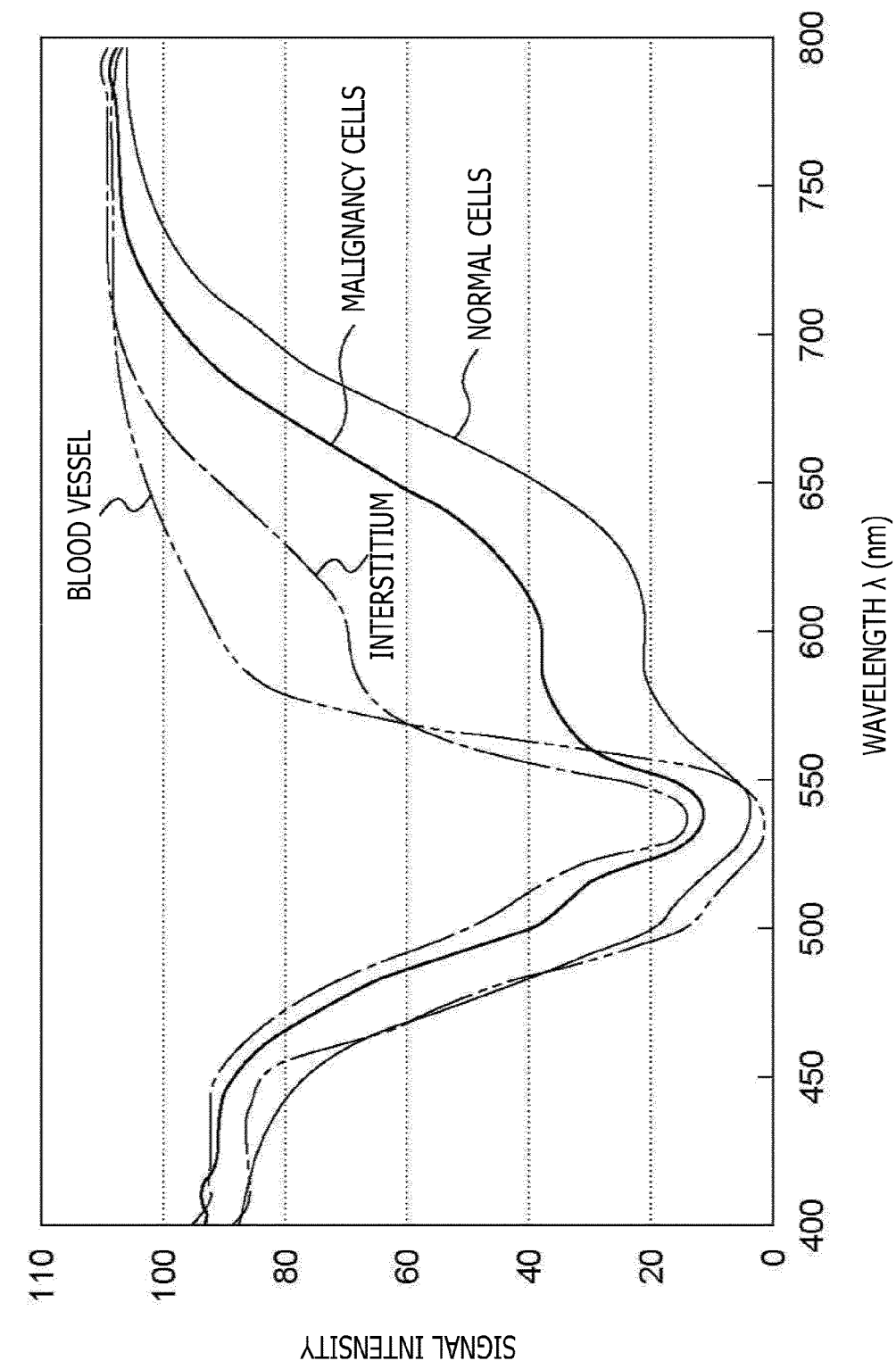
FIG. 24 is a graph depicting the results of continuous optical spectrum obtained by a tumor examination of Example 5 (medical application) of the present technology.

In this Example, an example of image application will be described. According to the present technology, accurate spectral characteristics and an image can be simultaneously obtained throughout an image surface (at any place on the image surface), and, therefore, it is applicable to medicine and cosmetics. FIG. 24 is a graph depicting the results of reflectance spectrum obtained by a tumor examination. The axis of ordinates represent signal intensity, and the axis of abscissas represents wavelength λ (nm). As illustrated in FIG. 24, by use of the solid-state imaging device according to the present technology, it has become possible to judge whether a part under examination is a tumor or not more accurately, by acquiring an optical spectrum in regard of the reflected light from cell surfaces, together with the image of the tumor. As depicted in FIG. 24, in a wavelength range of 550 to 800 nm, there were differences in the shape of continuous spectrum between normal cells, tumor cells, interstitium, and blood vessel. By acquiring the image simultaneously with the acquisition of the continuous spectrum with such detailed shape, it is possible to accurately determine what part of the cells is in an abnormal state. This leads to an accurate therapeutic judgement.

Figure 25A:
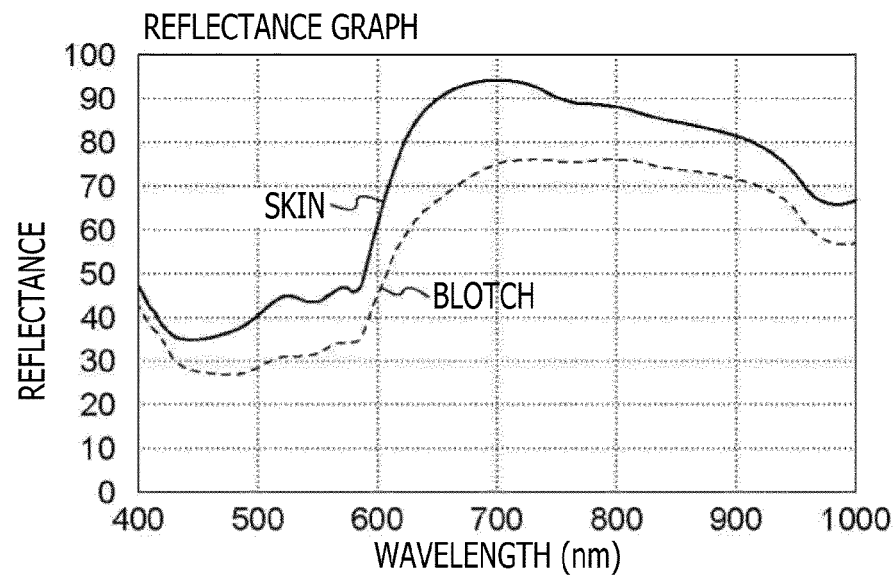
FIGS. 25A, 25B, and 25C illustrate graphs depicting the results of continuous optical spectra obtained by a blotch examination, a scalp examination, and hair moisture maintenance examination of Example 5 (cosmetic application) of the present technology.
Figure 25B:
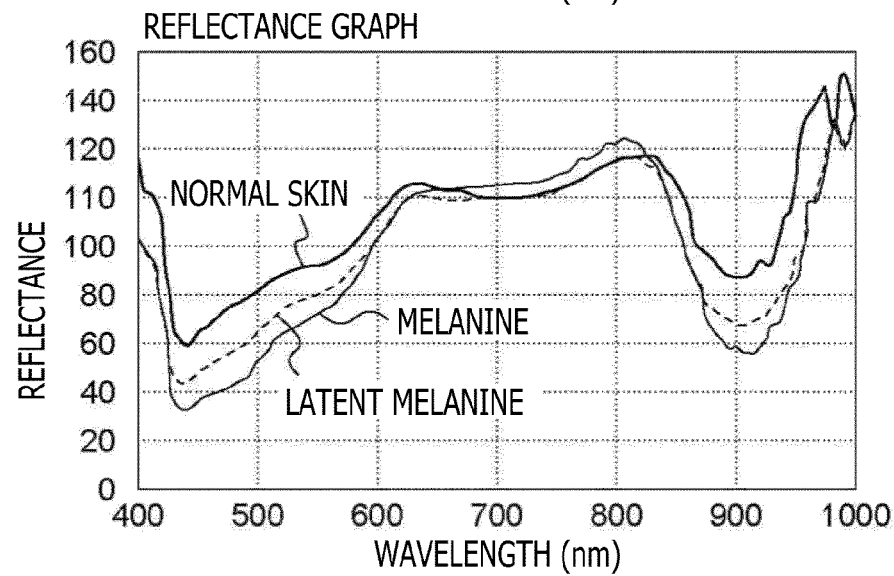
Figure 25C:
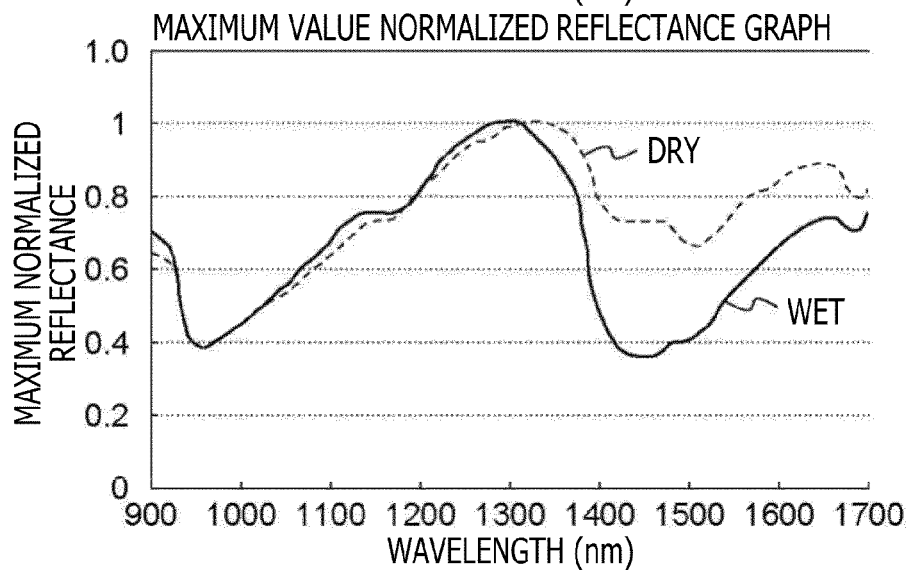

Further, using FIGS. 25A, 25B, and 25C, a cosmetic application of optical spectrum will be described. FIG. 25A is a graph depicting the results of reflectance spectrum obtained by a blotch examination as a cosmetic application. The axis of ordinates represents reflectance, and the axis of abscissas represents wavelength A (nm). FIG. 25B is a graph depicting the results of reflectance spectrum obtained by a scalp examination as a cosmetic application. The axis of ordinates represents reflectance, and the axis of abscissas represents wavelength A (nm). FIG. 25C is a graph depicting the results of reflectance spectrum obtained by a hair moisture maintenance examination as a cosmetic application. The axis of ordinates represents maximum normalized reflectance, and the axis of abscissas represents wavelength A (nm). Note that in the blotch examination, scalp examination, and hair moisture maintenance examination, the solid-state imaging device according to the present technology is used for acquiring accurate optical spectra at arbitrary places on the image surface.

As illustrated in FIG. 25A, in the blotch examination, the shape of reflectance spectrum of light from the surface is largely different between a normal skin part and a blotch part; therefore, where the blotch is can be determined by acquiring accurate optical spectra. Particularly, the determination can be made by acquiring the shape of reflectance spectrum at wavelengths of 450 to 900 nm and the image of blotch.

Similarly, in the scalp examination, as depicted in FIG. 25B, the shape of reflectance spectrum of light is different between a normal skin, latent melanin, and melanin; therefore, the parts of melanin and latent melanin could be recognized by acquiring accurate optical spectra. Particularly, the determination can be made from the shape of reflectance spectrum at wavelengths of 400 to 600 nm and wavelengths of 800 to 1,000 nm and the image of scalp.

Further, similarly, hair moisture maintenance state could be examined. As depicted in FIG. 25C, particularly, the determination can be made from the shape of reflectance spectrum at wavelengths of 1,300 to 1,700 nm and the image of hair.

In this way, by acquiring accurate optical spectra and suitable images, it is possible, in cosmetic field, to grasp the states of skin, scalp, hair and the like and thereby to cope with the states.

Example 6

Figure 26:
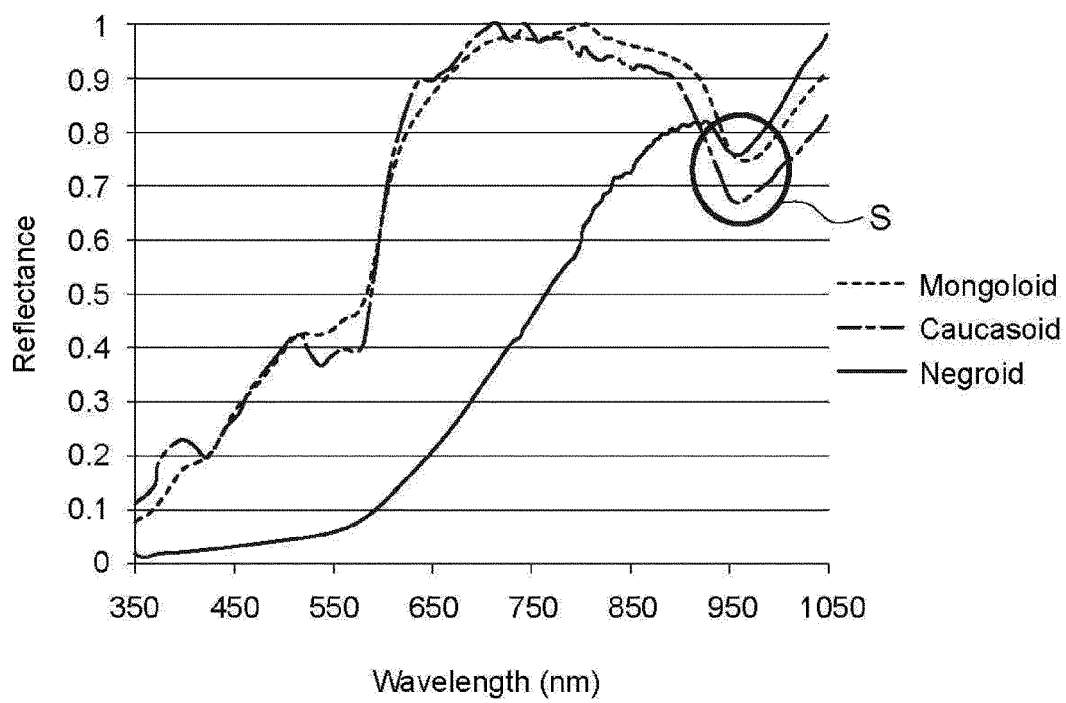
FIG. 26 is a graph depicting the results of light reflection from a human skin obtained by Example 6 (biometrics authentication) of the present technology.

According to the present technology, it is possible to acquire an image simultaneously with accurate spectral characteristics at an arbitrary place on the image surface, and, therefore, it is applicable to biometrics authentication. FIG. 26 is a diagram depicting optical spectra of light reflected from human skins (Mongoloid, Caucasoid, and Negloid). In FIG. 26, the axis of ordinates represents reflectance, and the axis of abscissas represents wavelength (nm).

By acquiring accurate optical spectrum and an image, it is possible to determine whether a part under examination is a human skin or a counterfeit, as illustrated in FIG. 26. In addition, in the circle mark S (wavelength: approximately 950 nm) in FIG. 26, reflectance differs largely between Mongoloid, Caucasoid, and Negloid, so that it is possible to distinguish which of the races Mongoloid, Caucasoid, and Negloid the target under examination is.

Besides, in other fields than the above-mentioned, it is possible to discriminate a normal leaf and a withered leaf, since chlorophyll concentration of leaves has interrelation with reflectance spectrum. By this discrimination, an application to growth state sensing in the agricultural field becomes possible. Further, acquisition of a spectrum is necessary for analysis of constituents of drugs, and application to such analysis becomes also possible.

Note that the present technology is not limited to the above-described embodiments and Examples, and various modifications are possible without departing from the scope of the gist of the present technology.

In addition, as for the effects of the present technology, the effects described herein are merely examples and are not limitative, so that the present technology may have other effects.

Besides, the present technology may take the following configurations.

(1)

A solid-state imaging device including:

a functional element, a spectroscopic element, a semiconductor substrate, and a photoelectric conversion element formed in the semiconductor substrate, in which the spectroscopic element is disposed between the functional element and the photoelectric conversion element, and the functional element corrects incident light to light in a direction substantially perpendicular to the photoelectric conversion element.

(2)

The solid-state imaging device according as described in the above paragraph (1), in which a plurality of pixels is arranged one-dimensionally or two-dimensionally, and the functional element, the spectroscopic element, and the photoelectric conversion element are provided on the pixel basis.

(3)

The solid-state imaging device as described in the above paragraph (1), in which a plurality of pixels is arranged one-dimensionally or two-dimensionally, the functional element and the spectroscopic element are provided on the basis of at least two of the pixels, and the photoelectric conversion element is provided on the pixel basis.

(4)

The solid-state imaging device as described in any one of the above paragraphs (1) to (3), in which the functional element has a focusing function.

(5)

The solid-state imaging device as described in any one of the above paragraphs (1) to (4), in which the functional element includes a substrate having a curved surface shape.

(6)

The solid-state imaging device as described in any one of the above paragraphs (1) to (5), in which the functional element has a refractive index distribution structure, and the refractive index distribution structure is asymmetric.

(7)

The solid-state imaging device as described in the above paragraph (6), in which the refractive index distribution structure has a pattern including a high refractive index material and a low refractive index material.

(8)

The solid-state imaging device as described in the above paragraph (6) or (7), in which the refractive index distribution structure has a pattern which includes a high refractive index material and a low refractive index material and which has a gap of not more than a wavelength order.

(9)

The solid-state imaging device as described in any one of the above paragraphs (6) to (8), in which the refractive index distribution structure has a ring pattern or a polygonal pattern.

(10)

The solid-state imaging device as described in any one of the above paragraphs (6) to (9), in which the asymmetry of the refractive index distribution structure varies according to a size of image height with reference to a center of an imaging surface.

(11)

The solid-state imaging device as described in any one of the above paragraphs (1) to (10), in which a correcting power for correcting the incident light to light in a direction substantially perpendicular to the photoelectric conversion element varies according to the size of image height with reference to a center of an imaging surface.

(12)

The solid-state imaging device as described in any one of the above paragraphs (1) to (11), in which the spectroscopic element includes at least one optical interference filter.

(13)

The solid-state imaging device as described in any one of the above paragraphs (1) to (11), in which the spectroscopic element includes a metallic film having a hole array structure.

(14)

An electronic apparatus including:

the solid-state imaging device as described in any one of the above paragraphs (1) to (13).

REFERENCE SIGNS LIST

1 . . . Optical interference filter,
10 . . . Spectroscopic element (Fabry-Perot resonator),
20, 20A to 20D, 30, 101 (101-1, 101-2), 201 (201-1, 201-2), 301 (301-1, 301-2), 401, 501, 701, 801, 901 . . . Functional element,
102 (102-1, 102-2), 202 (202-1, 202-2), 302 (302-1, 302-2), 402, 502, 602, 702, 902A (902A-1, 902A-2), 902B . . . Spectroscopic element,
103 (103-1, 103-2), 203 (203-1, 203-2), 303 (303-1, 303-2), 403, 903A (903A-1, 902A-2), 903B . . . Semiconductor substrate,
104 (104-1, 104-2), 204 (204-1, 204-2), 304 (304-1, 304-2), 404 (404-1 to 404-$n$), 904A (904A-1, 904A-2), 904B (904B-1, 904B-2) . . . Photoelectric conversion element (Photodiode),
100, 200, 300, 400, 500, 600, 700, 800, 900A, 900B . . . Solid-state imaging device.

The invention claimed is:

1. A solid-state imaging device comprising:
a functional element;
a spectroscopic element;
a semiconductor substrate; and
a photoelectric conversion element formed in the semiconductor substrate,
wherein the spectroscopic element is disposed between the functional element and the photoelectric conversion element,
wherein the functional element is configured to correct incident light to light in a direction perpendicular to the photoelectric conversion element, and
wherein a correcting power to correct the incident light to the light in the direction perpendicular to the photoelectric conversion element varies based on a size of image height with reference to a center of an imaging surface.

2. The solid-state imaging device according to claim 1, wherein a plurality of pixels is arranged one-dimensionally or two-dimensionally, and the functional element, the spectroscopic element, and the photoelectric conversion element are provided on pixel basis.

3. The solid-state imaging device according to claim 1, wherein a plurality of pixels is arranged one-dimensionally or two-dimensionally, the functional element and the spectroscopic element are provided on a basis of at least two of the pixels, and the photoelectric conversion element is provided on the pixel basis.

4. The solid-state imaging device according to claim 1, wherein the functional element has a focusing function.

5. The solid-state imaging device according to claim 1, wherein the functional element includes a substrate having that has a curved surface shape.

6. The solid-state imaging device according to claim 1, wherein the functional element has a refractive index distribution structure, and the refractive index distribution structure is asymmetric.

7. The solid-state imaging device according to claim 6, wherein the refractive index distribution structure has a pattern that includes a high refractive index material and a low refractive index material.

8. The solid-state imaging device according to claim 6, wherein the refractive index distribution structure has a pattern which includes a high refractive index material and a low refractive index material and which has a gap that is less than or equal to a wavelength order.

9. The solid-state imaging device according to claim 6, wherein the refractive index distribution structure has a ring pattern.

10. The solid-state imaging device according to claim 6, wherein the asymmetry of the refractive index distribution structure varies based on the size of image height with reference to the center of the imaging surface.

11. The solid-state imaging device according to claim 1, wherein the spectroscopic element includes at least one optical interference filter.

12. The solid-state imaging device according to claim 1, wherein the spectroscopic element includes a metallic film having a hole array structure.

13. An electronic apparatus comprising:
the solid-state imaging device according to claim 1.

14. A solid-state imaging device comprising:
a functional element;
a spectroscopic element;
a semiconductor substrate; and
a photoelectric conversion element formed in the semiconductor substrate,
wherein the spectroscopic element is disposed between the functional element and the photoelectric conversion element,
wherein the functional element has a refractive index distribution structure that is asymmetric,
wherein the asymmetry of the refractive index distribution structure varies based on a size of an image height with reference to a center of an imaging surface, and
wherein the functional element is configured to correct incident light to light in a direction perpendicular to the photoelectric conversion element.

* * * * *